(12) United States Patent
Wada

(10) Patent No.: US 8,537,594 B2
(45) Date of Patent: Sep. 17, 2013

(54) RESISTANCE CHANGE ELEMENT AND RESISTANCE CHANGE MEMORY

(75) Inventor: Junichi Wada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 95 days.

(21) Appl. No.: 13/176,188

(22) Filed: Jul. 5, 2011

(65) Prior Publication Data

US 2012/0069625 A1    Mar. 22, 2012

(30) Foreign Application Priority Data

Sep. 21, 2010   (JP) ................................ 2010-211270

(51) Int. Cl.
*G11C 11/00*   (2006.01)

(52) U.S. Cl.
USPC ........................................................ 365/148

(58) Field of Classification Search
USPC ........................................................ 365/148
See application file for complete search history.

(56) References Cited

U.S. PATENT DOCUMENTS

| 2008/0090337 | A1 | 4/2008 | Williams |
| 2010/0059837 | A1* | 3/2010 | Kim et al. ..................... 257/421 |
| 2010/0096716 | A1* | 4/2010 | Ranjan et al. ................. 257/421 |
| 2010/0241787 | A1* | 9/2010 | Goldman et al. ............. 711/103 |
| 2010/0314602 | A1 | 12/2010 | Takano et al. |
| 2011/0037043 | A1 | 2/2011 | Wada et al. |
| 2011/0089393 | A1* | 4/2011 | Chang et al. ...................... 257/4 |

FOREIGN PATENT DOCUMENTS

| JP | 2009-218260 | 9/2009 |
| JP | 2009-267204 | 11/2009 |
| JP | 2010-62247 | 3/2010 |

OTHER PUBLICATIONS

U.S. Appl. No. 13/225,926, Sep. 6, 2011, Matsuo.

* cited by examiner

*Primary Examiner* — Hoai V Ho
*Assistant Examiner* — Min Huang
(74) *Attorney, Agent, or Firm* — Oblon, Spivak, McClelland, Maier & Neustadt, L.L.P.

(57) ABSTRACT

According to one embodiment, a resistance change element includes a first film provided on a first electrode side, a second film provided on a second electrode side, a barrier film sandwiched between the first film and the second film, and metal impurities added in the first or second film, the metal impurities migrating between the first and second films bi-directionally according to a direction of a first electric field generated between the first and second electrodes. The resistance change element has a first resistance state when the metal impurities are present in the first film, and the resistance change element has a second resistance state different from the first resistance state when the metal impurities are present in the second film.

20 Claims, 13 Drawing Sheets

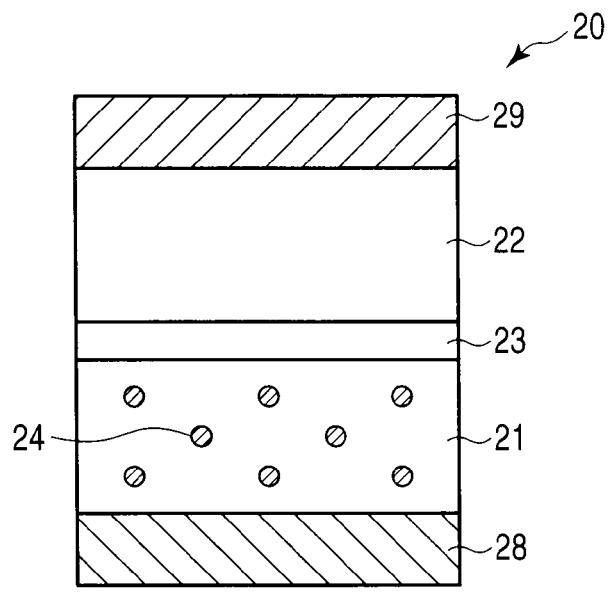
F I G. 1
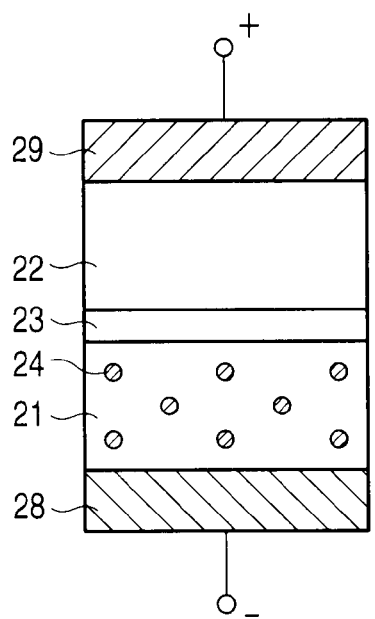
Low-resistance state
F I G. 2 A
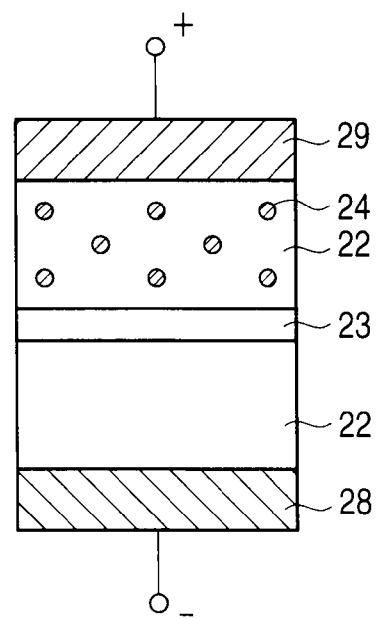
High-resistance state
F I G. 2 B

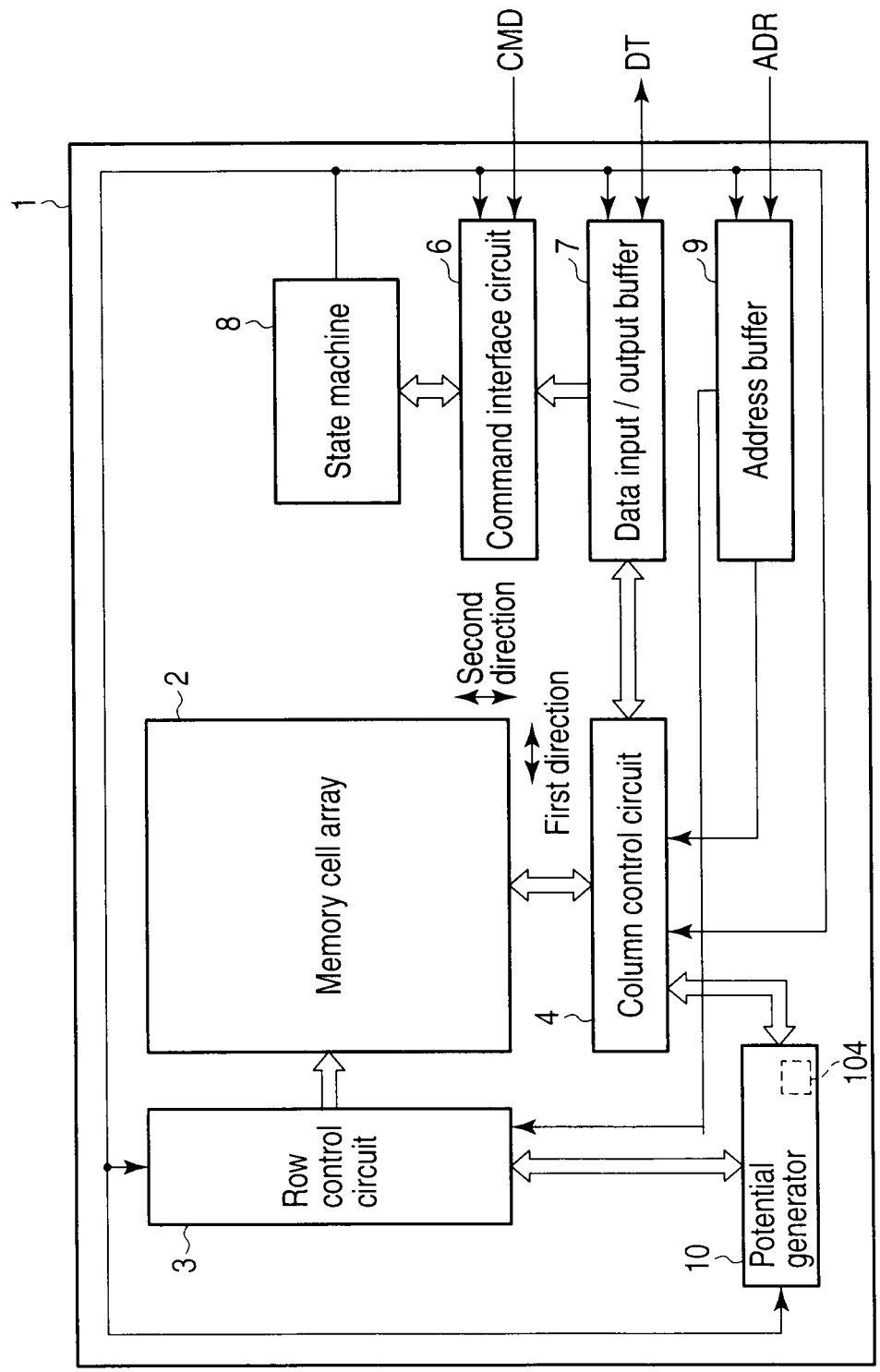
F I G. 5

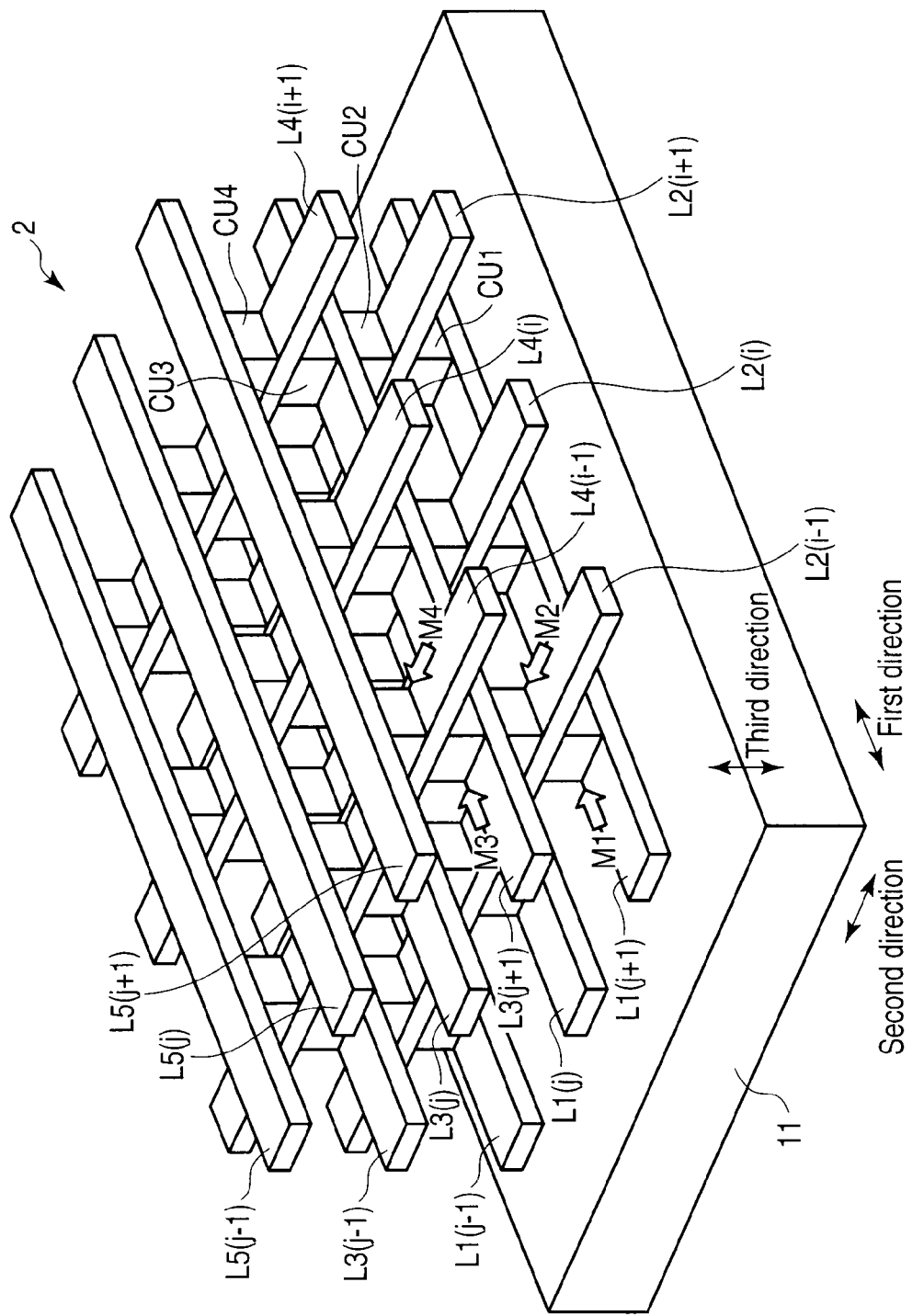
F I G. 6

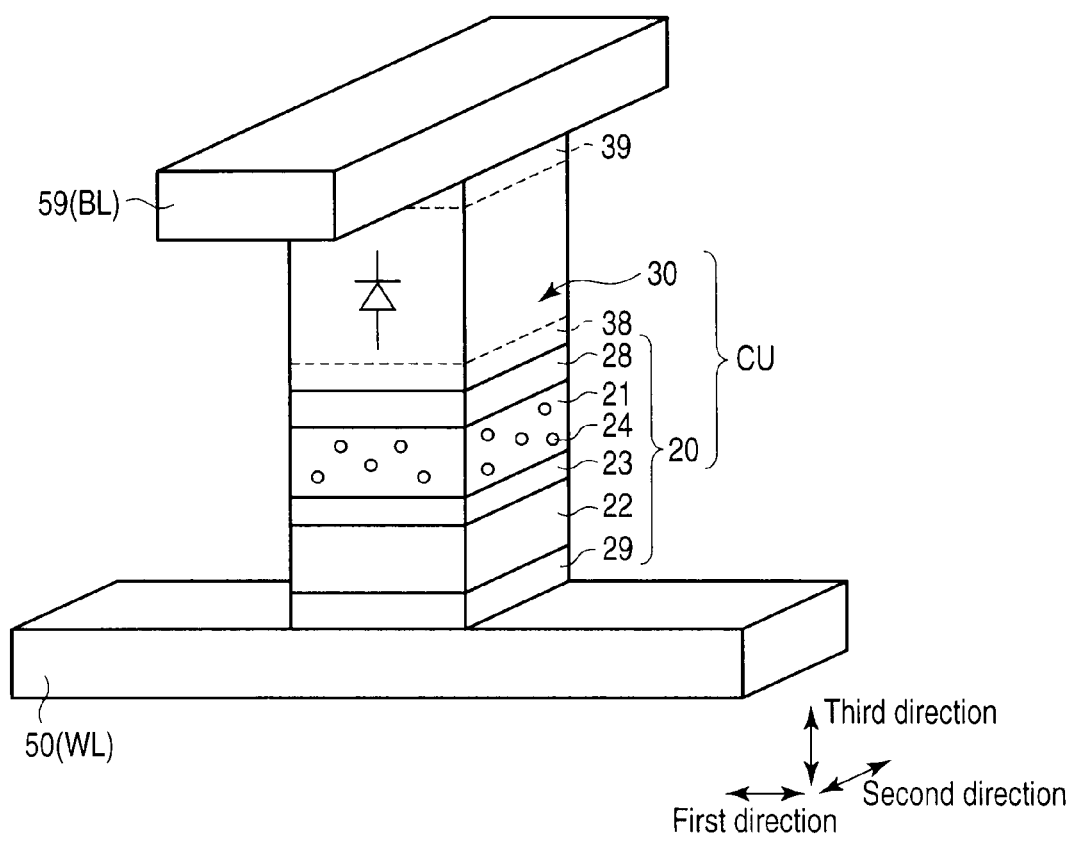
F I G. 8

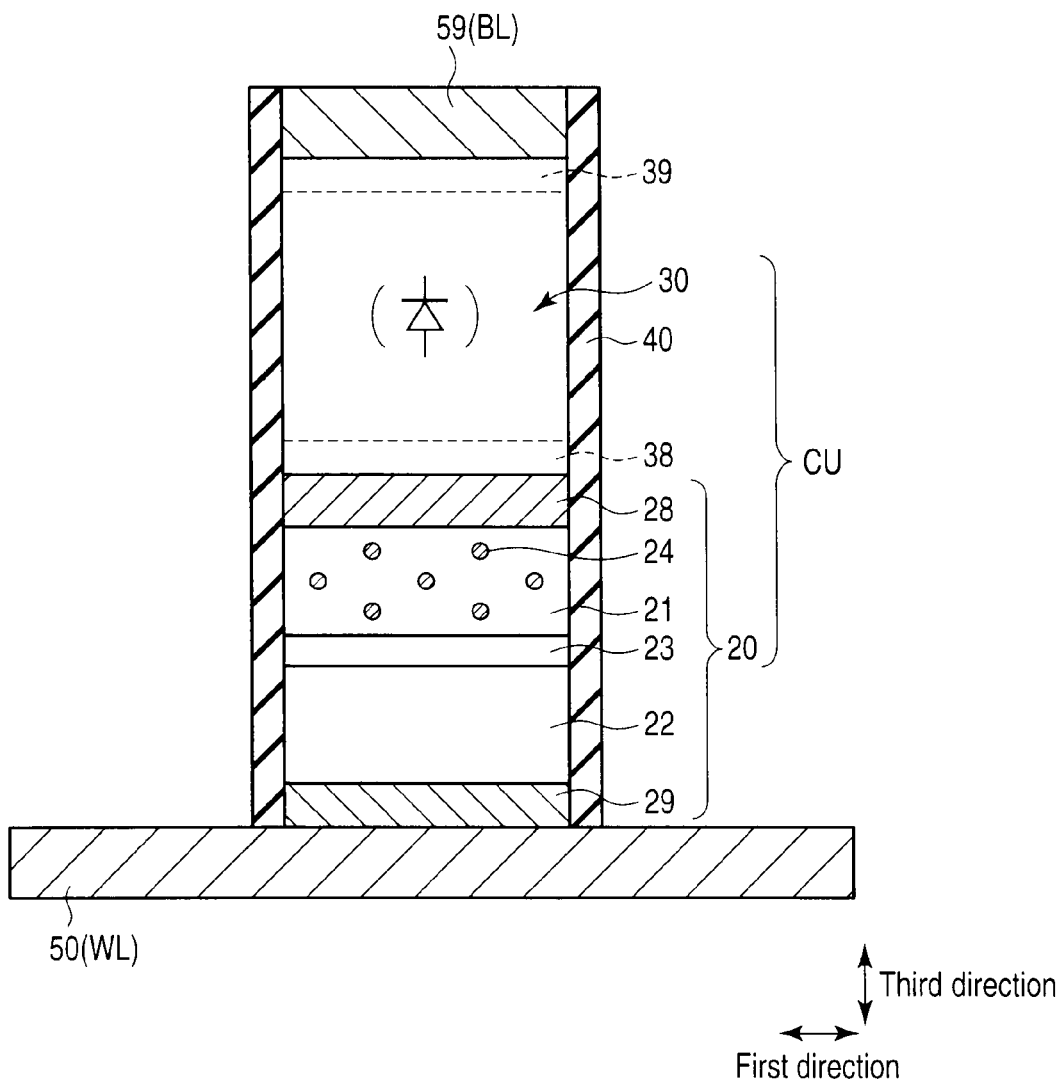
F I G. 9

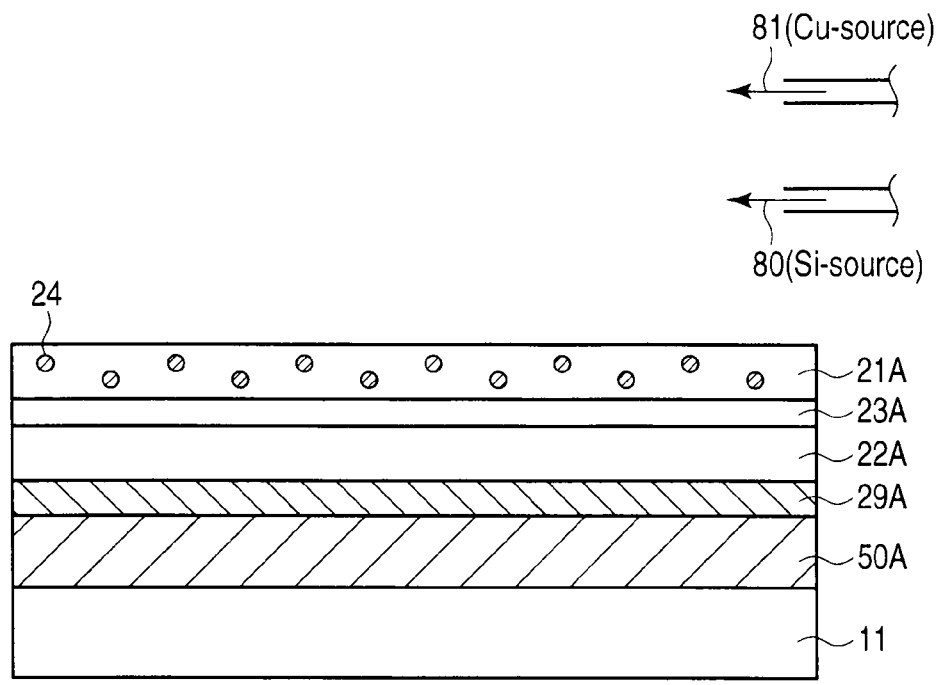
FIG.11
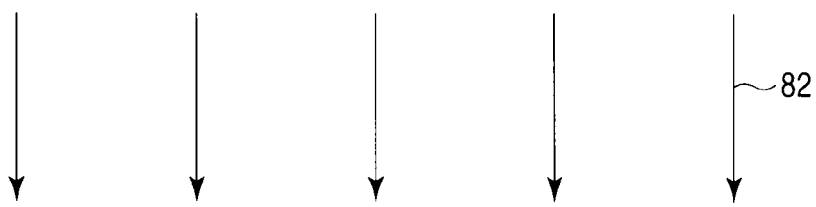
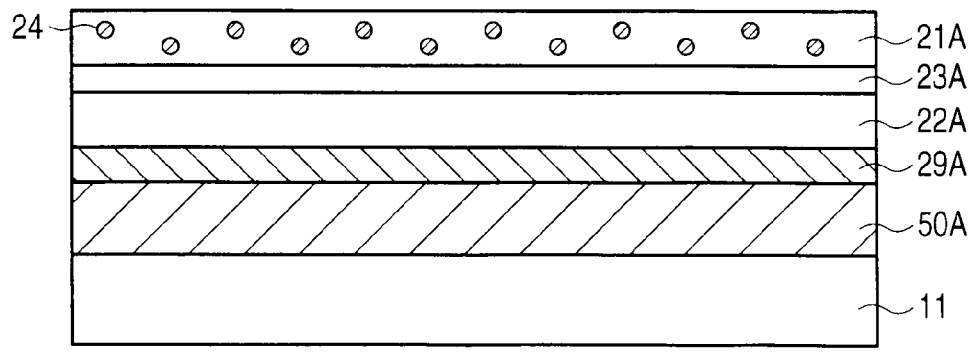
FIG.12

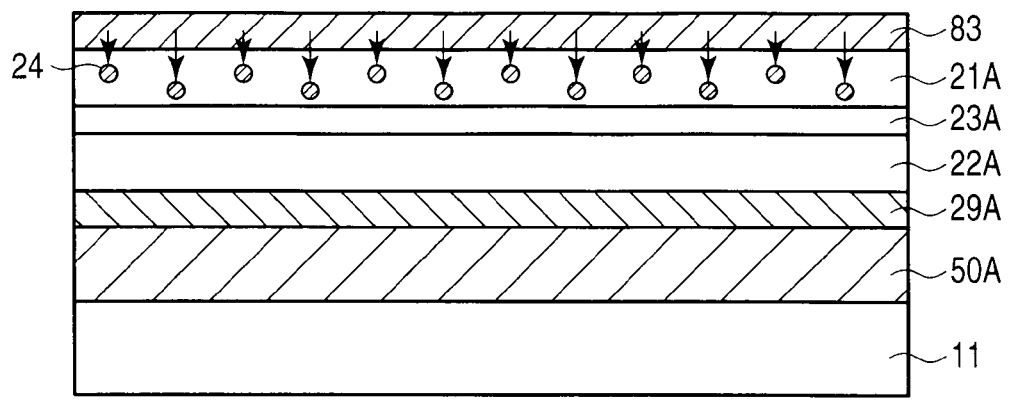
F I G. 1 3
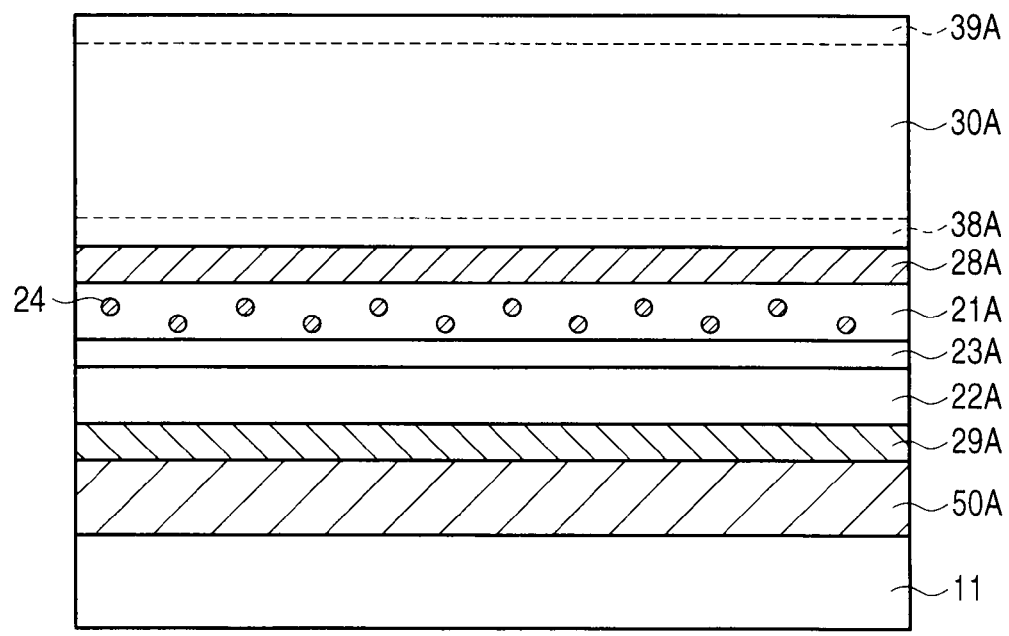
F I G. 1 4

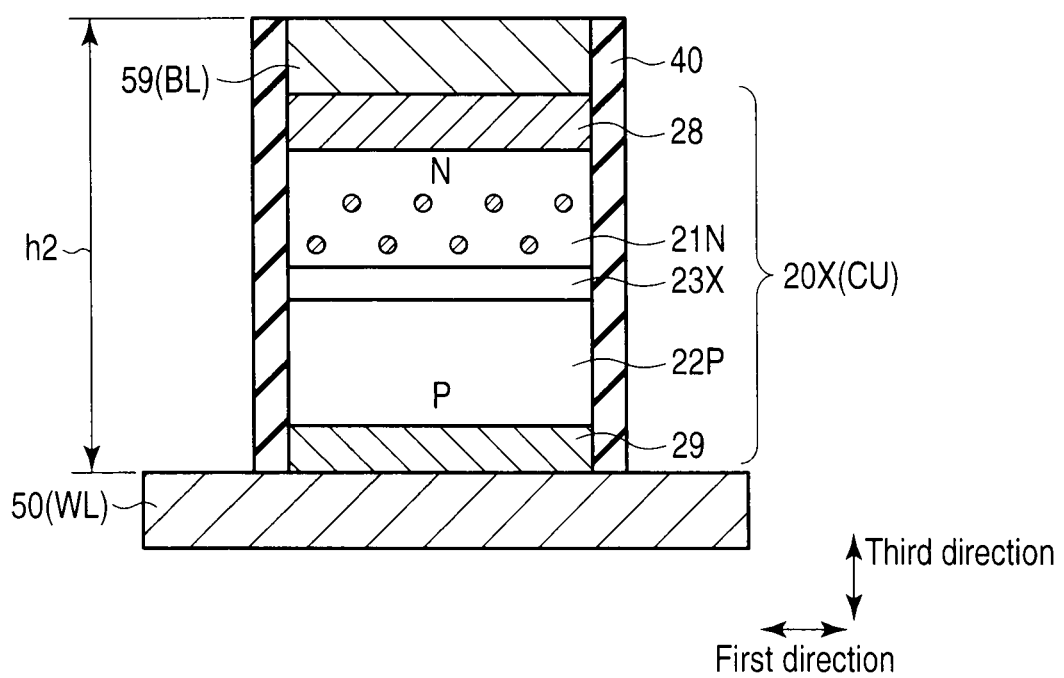
F I G. 17

RESISTANCE CHANGE ELEMENT AND RESISTANCE CHANGE MEMORY

CROSS-REFERENCE TO RELATED APPLICATIONS

This application is based upon and claims the benefit of priority from Japanese Patent Application No. 2010-211270, filed Sep. 21, 2010; the entire contents of which are incorporated herein by reference.

FIELD

Embodiments described herein relate generally to a resistance change element and a resistance change memory.

BACKGROUND

As a resistance change memory is mostly unaffected by miniaturization, its capacity can be increased, thus it attracts attention as a next-generation non-volatile memory.

The resistance change memory uses a reversible change in the resistance value of a resistance change element as a memory element for storing and discriminating data. The state of the resistance value of the resistance change element changes from the high-resistance state to the low-resistance state or from the low-resistance state to the high-resistance state by, for example, applying a voltage to resistance change films sandwiched between two electrodes and supplying a current to the resistance change film. An operation for shifting a resistance state of the resistance change element from the high-resistance state to the low-resistance state is called a set operation, and an operation for shifting a resistance state of the resistance change element from the low-resistance state to the high-resistance state is called a reset operation.

As the resistance change films of the resistance change element, a transition metal oxide film and the like are proposed. These resistance change films exhibit a high resistance value (insulating material) in an initial state immediately after they are formed. For this reason, during a production process of the resistance change memory in which the transition metal oxide film is used for the resistance change film, performed is a step called forming for shifting the resistance change film so as to have the low resistance value by supplying a current to the resistance change element while adjusting a voltage and forming a miniaturized current path called a filament in the resistance change film.

The resistance change memory in which the transition metal oxide film is used for the resistance change film has the following problems: it takes time to perform a step of forming; a large current flows in a circuit when performing a step of forming or a set operation, which destroys the resistance change film; when performing a reset operation for an element having too low a resistance value in a low-resistance state, a large current flows in a circuit which destroys a driving element or a protection element; a voltage value and a current value vary when performing a set operation and a reset operation; if the difference between a set voltage and a reset voltage is small, a determination voltage cannot be set at the reading operation time.

Moreover, when part of a filament formed by performing a step of forming is oxidized, or a metal oxide film is destroyed again, which may change the resistance value of the resistance change element, the increased number of rewriting data and the extension of the data hold time are in a trade-off relationship. For this reason, the reliability of the resistance change element as a memory element may not be ensured.

BRIEF DESCRIPTION OF THE DRAWINGS

FIG. 1 is a sectional view illustrating a structure of a resistance change element of a first embodiment;

FIGS. 2A and 2B are views explaining a resistance state of the resistance change element of the first embodiment;

FIG. 5 is a view explaining an application example of the resistance change element of the first embodiment;

FIG. 6 is a bird's eye view illustrating a structure of a cross-point type memory cell array;

FIG. 8 is a bird's eye view illustrating a structure of a cell unit;

FIG. 9 is a sectional view illustrating the structure of the cell unit;

FIG. 11 is a sectional flow diagram illustrating one step of a production process of the resistance change element;

FIG. 12 is a sectional flow diagram illustrating one step of the production process of the resistance change element;

FIG. 13 is a sectional flow diagram illustrating one step of the production process of the resistance change element;

FIG. 14 is a sectional flow diagram illustrating one step of the production process of the resistance change element;

FIG. 17 is a view for explaining a structure of a resistance change element of a second embodiment.

DETAILED DESCRIPTION

Figures 3A, 3B:
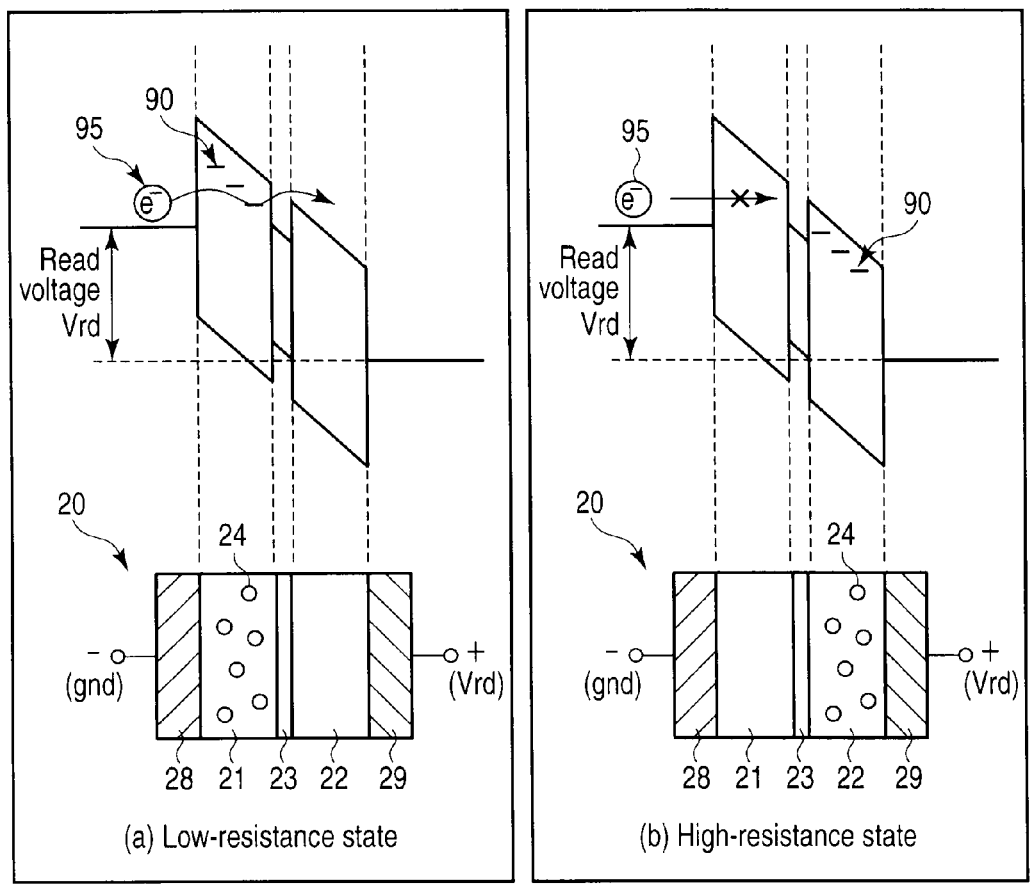
FIGS. 3A and 3B are views explaining operations of the resistance change element of the first embodiment.

With reference to the accompanying drawings, an embodiment will be hereinafter explained in detail. In the following explanation, the same reference numeral denotes the same element having the same function and structure and a duplicate explanation will be made where necessary.

In general, according to one embodiment, a resistance change element includes a first film provided on a first electrode side; a second film provided on a second electrode side; a barrier film sandwiched between the first film and the second film; and metal impurities added in the first or second film, the metal impurities migrating between the first and second films bi-directionally according to a direction of a first electric field generated between the first and second electrodes. In the resistance change element, a first resistance state is exhibited when the metal impurities are present in the first film, and a second resistance state different from the first resistance state is exhibited when the metal impurities are present in the second film.

EMBODIMENT

(1) First Embodiment

With reference to FIGS. 1 to 16, a resistance change element of a first embodiment will be explained.

(a) Basic Example

Using FIGS. 1 to 3, a basic example of a resistance change element 20 of the first embodiment will be explained.

FIG. 1 shows a cross-sectional structure of a basic structure of the resistance change element of the first embodiment.

As shown in FIG. 1, the resistance change element 20 of the present embodiment includes a first film 21, a second film 22 and a barrier film 23 sandwiched by the two films 21 and 22. The films 21 and 22 which sandwich the barrier film 23 in the resistance change element 20 are hereinafter called a first resistance film 21 and a second resistance film 22.

A stacked structure including the resistance films 21, 22 and the barrier film is sandwiched by two electrodes 28, 29. The first electrode 28 is adjacent to the first resistance film 21. The second electrode 29 is adjacent to the second resistance film 22.

Impurities 24 are added to the first or second resistance film 21, 22. The impurities 24 are, for example, metal atoms. The metal atom added to the resistance films 21, 22 as the impurity 24 will be hereinafter called metal impurity 24. The metal impurities 24 are ionized by a voltage of a predetermined magnitude or larger (first voltage) applied between the electrodes 28, 29, and migrate between the two resistance films 21, 22 according to the direction of electric field caused by the voltage. The phenomenon in which the metal impurities 24 are diffused (migrated) in the resistance films 21, 22 and between the resistance films 21, 22 by the electric field will be hereinafter called electromigration.

The material of the first and second resistance films 21, 22 is a material having a band gap, namely an insulating body or a semiconductor. For example, at least one material selected from Si, $SiO_2$, SiCO, Ge, TiOx, C, SiGe and the like is used as a material of the resistance films 21, 22. The first and second resistance films 21, 22 may be made of different materials from each other.

The barrier film 23 inhibits diffusion (for example, thermal diffusion) of the metal impurities between the two resistance films 21, 22 in a state where no voltage is applied between terminals of the resistance change element 20 or where a potential difference between the terminals is small. If the barrier film 23 has a function of inhibiting the diffusion of the above-described metal impurities 24, any of materials such as insulating film, semiconductor, metal, metal compound may be used as the material of the barrier film 23. For example, at least one material selected from $SiO_x$, $SiN_x$, $SiC_x$, $TiO_x$, $TiN_x$, Ta, $TaO_x$, $TaN_x$, Nb, $NbO_x$, $NbN_x$, W, $WO_x$, $WN_x$ (for example, x=1 to 2) and the like is used as the material of the barrier film 23.

In the present embodiment, a case where the barrier film 23 has a single-layer structure will be mainly explained; however, needless to say, the barrier film 23 may have a laminated structure.

Preferably the metal impurity 24 to be added to the resistance films 21, 22 is element which is easily electromigrated in the resistance films 21, 22 and between the two resistance films 21, 22 when a voltage is applied to the resistance films 21, 22. Moreover, preferably, the metal impurities 24 are elements that do not readily chemically react with the resistance films 21, 22 and cannot easily be lattice-substituted with constituting elements of the resistance films 21, 22. As the metal impurity 24 in the resistance films 21, 22, for example, at least one element selected from Cu, Ag, Ni and the like is used.

The material of the electrodes 28, 29 of the resistance change element 20 is, for example, TiN. However, the material of the electrodes 28, 29 may be other materials which do not chemically react with the resistance films 21, 22 and do not chemically react with the metal impurities 24. For example, at least one material selected from $TaN_x$, $NbN_x$, $WN_x$, $MoN_x$, $WSi_x$ and the like may be used as the material of the electrodes 29, 29. Moreover, the first electrode 28 and the second electrode 29 may be made of different materials from each other. The first electrode 28 and the second electrode 29 may be made of different materials from each other, considering a contact resistance with interconnect lines which connect each electrode 28, 29 and other element. Moreover, the electrodes 28, 29 may have a laminated structure.

In the resistance change element 20 of the present embodiment, the metal impurities 24 are ionized by a potential difference of a predetermined magnitude or higher applied between the terminals of the resistance change element 20 (electrodes 28, 29) when writing data to the resistance change element as a memory device or erasing data therefrom. The ionized metal impurities 24 tunnel through the barrier film 23 and migrate from the first resistance film 21 to the second resistance film 22 or from the second resistance film 22 to the first resistance film 21 according to the direction of an electric field generated between the terminals.

Additionally, when reading data from the resistance change element 20 of the present embodiment (discriminating a resistance value), the resistance change element 20 exhibits different resistance values depending upon whether the metal impurities 24 are present in the resistance film 21 or in the resistance film 22. In addition, except when writing data or performing an erasing operation, the migration of the metal impurities 24 between the resistance films 21, 22 is inhibited by the existence of the barrier film 23. The film thickness of the barrier film 23 is set to a thickness that does not prevent electromigration of the metal impurities 24 when performing a write operation and an erasing operation and set to a thickness preventing diffusion of the metal impurities 24 except when performing a write operation and an erasing operation.

FIGS. 2A and 2B are schematic drawings illustrating a low-resistance state and a high-resistance state of the resistance change element 20 of the present embodiment, respectively. It is here assumed that the electrode 28 is on a low potential side (cathode side) and the electrode 29 is on a high potential side (anode side), when discriminating the resistance value of the resistance change element 20 of the present embodiment.

As shown in FIG. 2A, in the resistance change element 20 of the present embodiment, if the metal impurities 24 are present in the first resistance film 21 adjacent to the electrode 28 on the cathode side, the resistance change element 20 exhibits a low-resistance state (which is also called a write state, an on-state or a set state).

As shown in FIG. 2B, in the resistance change element 20 of the present embodiment, if the metal impurities 24 are present in the second resistance film 22 adjacent to the electrode 29 on the anode side, the resistance change element 20 exhibits a high-resistance state (which is also called an erased state, an off-state or a reset state).

Hereinafter, when reading data, the resistance film 21 that will be on the cathode side may be called a cathode film 21 and the resistance film that will be on the anode side may be called an anode film 22.

Using FIGS. 3A, 3B, 4A and 4B, an operation principle of the resistance change element 20 of the first embodiment will be explained.

Using FIGS. 3A and 3B, reading data of the resistance change element 20 (discriminating the resistance value) of the present embodiment will be explained.

FIGS. 3A and 3B schematically illustrate a band figure of each film of the resistance change element 20 when performing a read operation. FIG. 3A shows a case where the metal impurities 24 are present in the resistance film 21 on the cathode side when performing a read operation and FIG. 3B shows a case where the metal impurities 24 are present in the resistance film 22 on the anode side when performing a read operation.

When reading data, a voltage (hereinafter called "a read voltage") Vrd is applied between the terminals of the resistance change element 20 so that the electrode 28 is set on the cathode side and the electrode 29 is set on the anode side. The magnitude (absolute value) of the read voltage Vrd and an application time (pulse width) of the read voltage Vrd are set so that the metal impurities 24 are not electromigrated between the resistance films 21, 22.

For example, the read voltage Vrd is applied to the electrode 29 and a ground voltage (for example, 0 V) is applied to the electrode 28. The applied voltage Vrd brings about distortion of bands of each of the materials 21, 22, 23 having a band gap and band energy of the resistance films 21, 22 is tilted toward the electrode 29 on the anode side. The band energy (barrier) for electrons is then reduced.

The current (hereinafter called a read current) generated by the read voltage Vrd flows from the electrode 29 to the electrode 28.

As shown in FIG. 3A, the metal impurities 24 are present in the resistance film 21. The resistance film 21 is adjacent to the electrode 28 that is disposed on the cathode side when performing a read operation.

An impurity level 90 resulting from the metal impurities 24 is formed in the bad gap of the resistance film (cathode film) 21.

When performing a read operation, electrons 95 on the cathode side migrate from the electrode 28 on the cathode side to the electrode 29 on the anode side through the impurity level 90 and over the barrier film 23 formed in the resistance film 21 on the cathode side. For this reason, due to the read voltage Vrd, the read current from the electrode 29 on the anode side toward the electrode 28 on the cathode side flows in the resistance change element 20 in a direction opposite to a direction in which the electrons 95 migrate.

As shown in FIG. 3B, if the metal impurities 24 are present in the resistance film 22 adjacent to the electrode 29 on the anode side when performing a read operation, the impurity level 90 resulting from the metal impurities 24 is formed in the bad gap of the resistance film (anode film) 22 on the anode side. In other words, the impurity level resulting from the metal impurities 24 is not formed in the resistance film (cathode film) 21 on the cathode side.

As electrons 95 are supplied from the cathode side, a large portion of the electrons 95 supplied cannot exceed the band gap (band energy) of the resistance film 21 having no impurity level on the cathode side. For this reason, in the case of FIG. 3B, migration of the electrons 95 from the cathode side to the anode side through the impurity level 90 hardly occurs.

As a result, if the metal impurities 24 are present in the resistance film 22 that will be on the anode side when performing a read operation as shown in FIG. 3B, the current flowing in the resistance change element 20 is smaller than in a case where the metal impurities 24 are present in the resistance film 21 that will be on the cathode side when performing a read operation as shown in FIG. 3A.

For this reason, if the metal impurities 24 are present in the resistance film 22 that will be on the anode side when performing a read operation, the resistance change element 20 exhibits a higher resistance value than in a case where the metal impurities 24 are present in the resistance film 21 that will be on the cathode side when performing a read operation.

In addition, taking into account the above-described operation principle, the material of the barrier film 23 is preferably a material that does not inhibit the electromigration of the metal impurities 24 when writing and erasing data.

According to the above, in a case where the metal impurities 24 are present in the resistance film (cathode film) 21 provided on the cathode side when performing a read operation, the resistance change element 20 of the present embodiment exhibits a low-resistance state, and in a case where the metal impurities 24 are present in the resistance film (anode film) 22 on the anode side when performing a read operation, the resistance change element 20 of the present embodiment exhibits a high-resistance state.

The resistance change element of this embodiment may then employ two or more different resistance states (resistance values).

In addition, if the cathode side and the anode side of the resistance change element of the present embodiment are switched, the resistance states will be also reversed. Therefore, in order to realize a simple read operation, the polarity of the read voltage Vrd applied to the certain resistance change element 20 is preferably unchanged. The potential difference applied to the resistance change element 20 when performing a read operation has preferably a constant magnitude that does not depend upon in which of the resistance films 21 and 22 the metal impurities 24 are present.

Using FIGS. 4A and 4B, an operation for shifting a resistance state of the resistance change element 20 of the present embodiment to the low-resistance state (called "a set operation" or "a write operation") and an operation for shifting a resistance state of the resistance change element 20 to the high-resistance state (called "an erasing operation" or "a reset operation") will be explained. In addition, a relationship between the resistance state of the resistance change element 20 and existence or non-existence of the metal impurities in the resistance films 21, 22 is the same as that shown in FIGS. 3A and 3B.

Figures 4A, 4B:
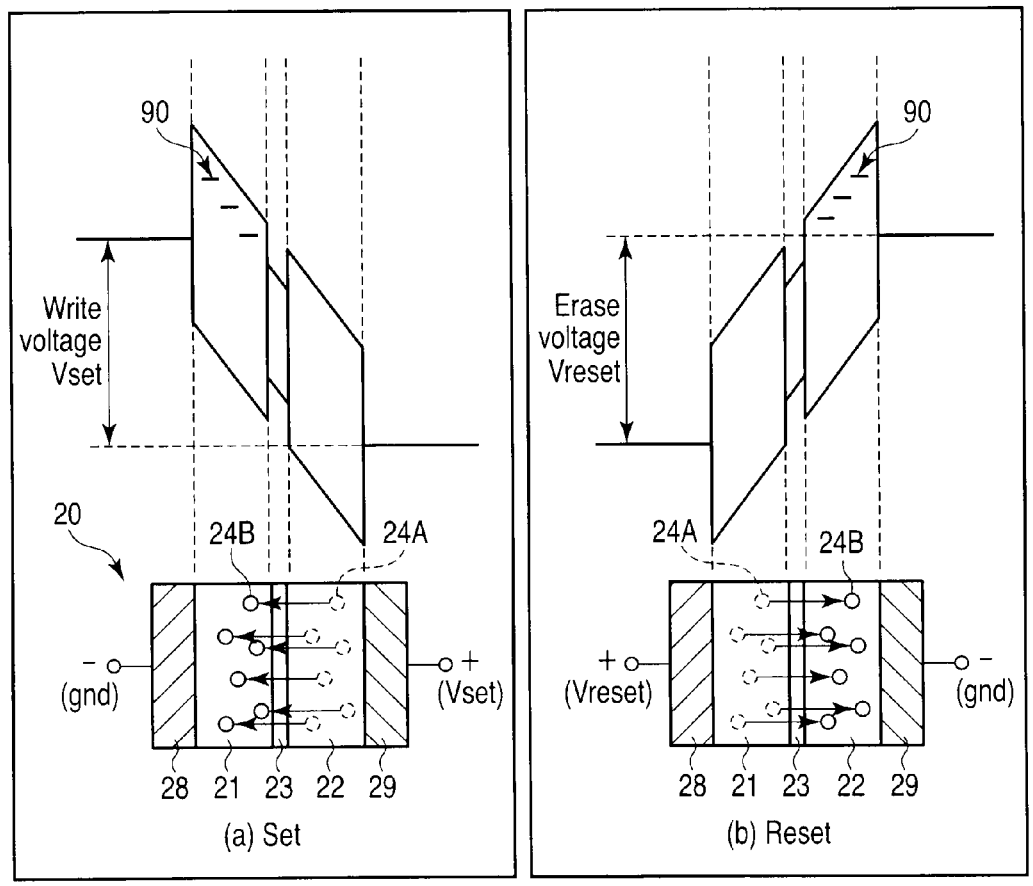
FIGS. 4A and 4B are views explaining operations of the resistance change element of the first embodiment.

FIG. 4A schematically illustrates a band figure of each of the films 21, 22, 23 included in the resistance change element 20 and movement of metal impurities (metal ions) 24A, 24B when performing the set operation to the resistance change element 20 of the first embodiment.

As shown in FIG. 4A, the metal impurities 24A are present in the resistance film 22 before the set operation to the resistance change element 20 is performed.

When performing the set operation to (writing data to) the resistance change element of the present embodiment, the voltage (the set voltage or the write voltage) Vset is applied between the terminals of the resistance change element 20 so that the electrode 28 is set on the low potential side (cathode side), and the electrode 29 is set on the high potential side (anode side). For example, a positive potential Vset is applied to the electrode 29 and a ground potential gnd (for example, 0 V) is applied to the electrode 28. In addition, if the potential difference between the electrodes 28, 29 is the set voltage Vset, the positive potential equal to or lower than the voltage Vset may be applied to the electrode 29 and the negative potential lower than 0 V may be applied to the electrode 28.

The set voltage Vset is higher than the read voltage Vrd. The set voltage Vset (voltage value) has a magnitude such that the metal impurities in the resistance films are ionized and the ionized metal impurities migrate (electromigration) between the two resistance films 21, 22. Moreover, the application time (pulse width) of the set voltage Vset is set equal to or longer than the time from the ionization of the metal ions to the occurrence of the electromigration.

The polarity of the set voltage Vset applied to the resistance change element 20 when performing the set operation is the same as, for example, the polarity of the read voltage Vrd applied to the resistance change element 20 when performing the read operation.

The applied set voltage Vset brings about distortion of the band gap of the resistance films 21, 22 and barrier film 23 and the band energy is tilted toward the electrode 29 on the anode side.

The electric field is generated between the electrodes 28, 29 by the applied potential difference Vset. The generated electric field is directed from the electrode 29 to the electrode 28. Further, the metal impurities 24A in the resistance film 22 become positively charged ions due to the set voltage Vset applied between the electrodes 28, 29.

Due to the generated electric field, the ionized metal impurities (positively-charged metal ions) in the resistance film 22 exceed the barrier film 23 and migrate from the resistance film 22 on the anode side to the resistance film 21 on the cathode side.

The impurity level 90 is formed in the first resistance film (cathode film) 21 by the metal impurities 24B which have migrated into the resistance film 21. On the other hand, as the metal impurities are no more present in the resistance film 22, the impurity level disappears from the inside of the second resistance film (anode film) 22.

In such a state, the read operation shown in FIG. 3A is performed, whereby the resistance change element 20 exhibits the low-resistance state after the set operation has been performed as shown in FIG. 4.

FIG. 4B schematically illustrates a band figure of each of the films 21, 22, 23 included in the resistance change element 20 and movement of the metal impurities (metal ions) 24A, 24B when performing the reset operation of the resistance change element 20 of the first embodiment.

The metal impurities 24A are present in the resistance film 21 before the reset operation to the resistance change element 20 is performed.

When erasing data from the resistance change element 20 of the present embodiment, the voltage (called "the reset voltage" or "the erase voltage") Vreset is applied between the terminals of the resistance change element 20 so that the electrode 28 will be on the anode side, and the electrode 29 will be on the cathode side. For example, a positive potential Vreset is applied to the electrode 28 and a ground potential gnd (for example, 0 V) is applied to the electrode 29. In this way, the polarities of the voltage when performing the set/reset operation to the resistance change element 20 of the present embodiment are opposite to each other. Additionally, the polarity of the reset voltage Vreset applied to the resistance change element 20 during the reset operation is opposite to the polarity of the read voltage Vrd applied to the resistance change element 20 during the read operation.

The magnitude of the reset voltage Vreset (absolute value) is higher than that of the read voltage Vrd. The magnitude (absolute value) and the application time (pulse width) of the reset voltage Vreset are the same as, for example, those of the set voltage Vset. In addition, if the potential difference between the electrodes 28, 29 is the reset voltage Vreset, the positive potential equal to or lower than the voltage Vreset may be applied to the electrode 28 and the negative potential lower than 0 V may be applied to the electrode 29.

The applied reset voltage Vreset brings about distortion of the band gap of the resistance films 21, 22 and barrier film 23 and the band energy of the resistance films 21, 22 and the barrier film 23 is tilted toward the electrode 28 on the anode side. In the case of the reset operation, the electric field is generated which is directed from the electrode 28 to the electrode 29 by the reset voltage Vreset, which is opposite to a case of the set operation.

The metal atom 24A in the resistance film 21 on the anode side is ionized by the applied voltage Vreset.

Due to the electric field between the electrodes 28, 29, the ionized metal impurities (metal ions) 24A exceed the barrier film 23 and migrate from the resistance film 21 on the anode side to the resistance film 22 on the cathode side.

The impurity level 90 is formed in the band gap of the resistance film (anode film) 22 by the metal impurities 24B which have migrated into the resistance film 22. On the other hand, the impurity level resulting from the metal impurities in the resistance film (cathode film) 21 disappears.

In such a state, the read operation shown in FIG. 3B is performed, whereby the resistance change element 20 exhibits the high-resistance state after the reset operation has been performed as shown in FIG. 4B.

As shown in FIGS. 4A and 4B, in the resistance change element 20 of the present embodiment, the polarity of the voltage applied to the resistance change element 20 is changed to thereby allow the metal impurities 24 included in the resistance change element 20 to migrate between the two resistance films 21, 22 which sandwich the barrier film 23. In this way, the resistance change element 20 of the present embodiment is driven by a bipolar operation (bipolar mode).

The operations shown in FIGS. 4A and 4B allow the metal impurities 24A, 24B to migrate between the resistance films 21, 22, the resistance change element 20 of the present embodiment exhibits the low-resistance state or the high-resistance state when performing the read action shown in FIGS. 3A and 3B.

In addition, in FIGS. 3A, 3B, 4A and 4B, the absolute value of the read voltage Vrd is smaller than the absolute value of the set voltage Vset or the absolute value of the reset voltage Vreset. Further, the application time (pulse width) of the read voltage Vrd is preferably shorter than the application time of the set voltage Vset and the reset voltage Vreset.

In the present embodiment, a voltage such as the set voltage Vset and the reset voltage Vreset at which the metal impurities 24 in the resistance films 21, 22 are ionized and the electric field (a first electric field) resulting from the voltage allows the metal impurities 24 to diffuse may be hereinafter called an electromigration voltage (a first voltage). The absolute value of the read voltage (a second voltage) Vrd is smaller than the absolute value of the electromigration voltage. In addition, the electric field (the second electric field) is generated between the electrodes 28, 29 by the read voltage Vrd; however, this electric field has a magnitude which hardly causes the electromigration of the metal impurities 24.

As explained using FIGS. 3A, 3B, 4A and 4B, the resistance change element 20 of the present embodiment exhibits different resistance states depending upon whether the metal impurities 24 forming the impurity level 90 in the resistance film 21 are present or not in the resistance film 21 adjacent to the electrode 28 on the low potential side (anode side) when performing the read operation.

In the resistance change element 20 of the present embodiment, the electromigration resulting from the set/reset voltages Vset, Vreset may allow the metal impurities 24 in the resistance films 21, 22 to migrate between the two resistance films 21, 22 exceeding the barrier film 23. For example, the metal impurities 24 that have been ionized by the electric field tunnel through the barrier film 23. The migration of the metal impurities 24 may reversibly change the resistance state (resistance value) of the resistance change element 20 which is discriminated by reading.

Further, if the voltage is not applied to the resistance change element 20, or the low electric field, for example, when performing the read operation is applied to the resistance change element 20, the migration of the metal impurities between the resistance films 21, 22 is prevented by the barrier film 23 sandwiched between the resistance films 21, 22. For this reason, the resistance change element 20 of the present embodiment may store data in a substantially nonvolatile manner.

According to the above, the resistance change element 20 of the present embodiment may be used as a nonvolatile memory element by associating a resistance value varied into two or more values with data.

In the resistance change element 20 of the present embodiment, the barrier film 23 has a thickness which allows the electromigration of the ionized metal impurities 24 between the two resistance films 21, 22 within the application time of the write voltage or the erase voltage and a thickness which does not allow the migration between the two resistance films 21, 22 due to the electromigration within the application time of the read voltage Vrd. Further, if the voltage is not applied to the resistance change element 20, the barrier film 23 has a thickness which does not allow the metal impurities 24 to diffuse (migrate) between the two resistance films 21, 22. Such a thickness of the barrier film 23 is set, which thus inhibits the ionized metal impurities from exceeding the barrier film 23 due to the applied voltage when reading. Moreover, in the resistance change element 20 of the present embodiment, since the barrier film 23 is provided in the two resistance films 21, 22, data to be stored is then securely held.

For this reason, even if the resistance change element of the present embodiment is used as a memory element, erroneous reading of data may be reduced and retention characteristics of data may be improved. Therefore, reliability of the resistance change element 20 of the present embodiment as a memory element may be ensured.

According to the resistance change element 20 of the first embodiment, the magnitude of current flowing in the resistance change element 20 during the read operation depends on the relative number of impurity levels in the resistance film 21 on the cathode side. Therefore, a range of resistance values which the resistance change element may employ may be controlled in accordance with the concentration of the metal impurities 24 added to the first or second resistance film 21, 22. For this reason, a memory using the resistance change element of the present embodiment may decrease a current flowing in the resistance change element, as a result of which power consumption can be reduced. Further, the resistance change element 20 of the present embodiment may also scale values of current flowing in the resistance change element according to the size of the element 20. For this reason, the resistance change element 20 of the present embodiment may be miniaturized comparatively easily.

Moreover, a mechanism of change in the resistance state of the resistance change element 20 of the present embodiment is different from a mechanism of change in the resistance state resulting from a filament formed in the resistance change film. For this reason, the resistance change element 20 of the present embodiment eliminates necessity of a step of forming. Therefore, according to the resistance change element 20 of the present embodiment, the production process and production cost of the resistance change memory may be reduced thereby.

In addition, the mechanism in which electrons flow between the resistance films 21, 22 which sandwich the barrier film 23 through the impurity level formed by the metal impurities (ions) has been explained with reference to FIGS. 3 and 4. However, this may be applied to an operation principle different from an operation principle explained using FIGS. 3A, 3B, 4A and 4B. For example, an operation principle in which carriers in the two resistance films 21, 22 are trapped by the impurity level resulting from the metal impurities 24, which changes the resistance state of the resistance change element, may be used for an operation of the resistance change element 20 of the present embodiment.

In that case, the number of carriers which migrate between the resistance films 21, 22, namely values of current flowing in the resistance change element 20 are different depending upon whether the carriers are trapped by the impurity level when performing the read operation, and the resistance change element 20 exhibits either the low-resistance state or the high-resistance state.

Also, in an operation principle using trapping of carriers by the impurity level, the resistance state of the resistance change element 20 may be changed, which is substantially similar to an operation explained using FIGS. 3A, 3B, 4A and 4B. In that case, performing impurity doping activates a semiconductor film as the first or second resistance film 21 or 22 to generate carriers in the resistance films 21, 22, which is effective for further improvement of characteristics of the resistance change element 20.

As described above, according to the resistance change element of the first embodiment, the resistance change element with improved characteristics may be provided.

(b) Example of Application

Using FIGS. 5 to 10B, an example of applying the resistance change element of the first embodiment will be explained.

The resistance change element 20 of the present embodiment is applied to, for example, a memory element of the resistance change memory.

FIG. 5 shows a major portion of the resistance change memory.

A resistance change memory (for example, chip) 1 includes at least one memory cell array 2.

A row control circuit 3 is arranged at one end in a first direction (row direction) of the memory cell array 2, and a column control circuit 4 is arranged at one end in a second direction (column direction) that intersects the first direction.

The row control circuit 3 selects a row of the memory cell array 2 based on, for example, a row address signal. The column control circuit 4 selects a column of the memory cell array 2 based on, for example, a column address signal.

The row control circuit 3 and the column control circuit 4 control operations of a word line and a bit line connected to memory elements in the memory cell array 2, respectively.

A control signal CMD from the outside (for example, a host or a controller) is input in a command interface circuit 6. Data DT from the outside or data from the memory cell array is input into a data input/output buffer 7.

The command interface circuit 6 determines whether the data DT from the outside is command data or not based on a control signal CMD. If the data DT is the command data, the command interface circuit 6 transfers the data DT from the data input/output buffer 7 to a state machine 8.

The state machine 8 manages operations of the resistance change memory 1 based on the control signal CMD and the command data. For example, the state machine 8 manages the set/reset operation and the read operation based on the control signal CMD from the outside.

When the set/reset operation and the read operation, an address signal ADR is supplied into the resistance change memory 1 from the outside. The address signal ADR is input into the state machine 8 and the row and column control circuits 3, 4 through the address buffer 9.

A potential generator 10 generates a voltage pulse (or a current pulse) required for, for example, the set/reset operation and the read operation based on instructions from the state machine 8. The potential generator 10 includes, for example, a pulse generator therein. The pulse generator controls a pulse waveform of the voltage pulse generated.

The memory cell array 2 has, for example, a cross-point type structure.

FIG. 6 is a bird's eye view illustrating the structure of a cross-point type memory cell array.

The cross-point type memory cell array 2 is disposed on a substrate 11. The substrate 11 is a semiconductor substrate (for example, silicon substrate) or an interlayer insulation film on a semiconductor substrate. In addition, if the substrate 11 is the interlayer insulation film, a circuit using a field-effect transistor or the like may be formed on a surface of the semiconductor substrate below the cross-point type memory cell array 2 as a periphery circuit of the resistance change memory.

The cross-point type memory cell array 2 is configured by, for example, a stacked structure of a plurality of memory cell arrays (also called "a memory cell layer").

FIG. 6 shows a case where the cross-point type memory cell array 2 includes four memory cell arrays M1, M2, M3 and M4 stacked in a third direction (a direction perpendicular to a principle plane of the substrate 11) by way of example. The number of memory cell arrays to be stacked only needs to be two or more.

In addition, the cross-point type memory cell array 2 may be configured by one memory cell array. Further, the insulating film may be provided between the two memory cell arrays stacked and the two memory cell arrays may be electrically separated by the insulating film.

As shown in FIG. 6, if the plurality of memory cell arrays, M1, M2, M3 and M4 are stacked, an address signal includes, for example, a memory cell array selection signal, a row address signal, and a column address signal. The row and column control circuits 3, 4 select one of the plurality of memory cell arrays stacked based on, for example, the memory cell array selection signal. The row/column control circuits 3, 4 may perform control for writing data to/erasing data from/reading data from one of the plurality of memory cell arrays stacked and also perform control for simultaneously writing data to/erasing data from/reading data from two or more or all of the plurality of memory cell arrays stacked.

The memory cell array M1 includes a plurality of cell units CU1 arranged as an array in the first and second directions. Similarly, the memory cell array M2 includes a plurality of cell units CU2 arranged as an array, the memory cell array M3 includes a plurality of cell units CU3 arranged as an array, and the memory cell array M4 includes a plurality of cell units CU4 arranged as an array.

Moreover, control lines L1($j$−1), L1($j$), L1($j$+1), control lines L2($i$−1), L2($i$), L2($i$+1), control lines L3($j$−1), L3($j$), L3 ($j$+1), control lines L4($i$−1), L4($i$), L4($i$+1), and control lines L5($j$−1), L5($j$), L5($j$+1) are arranged on the substrate 11 in order from the substrate 11 side.

The odd-numbered interconnect line as counted from the substrate 11 side, namely the control lines L1($j$−1), L1($j$), L1($j$+1), the control lines L3($j$−1), L3($j$), L3($j$+1) and the control lines L5($j$−1), L5($j$), L5($j$+1) extend in the first direction (row direction).

The even-numbered interconnect line as counted from the substrate 11 side, namely the control lines L2($i$−1), L2($i$), L2($i$+1) and the control lines L4($i$−1), L4($i$), L4($i$+1) extend in the second direction (row direction) that intersects the first direction.

These control lines are used as a word line or a bit line.

The undermost first memory cell array M1 is arranged between the first control lines L1($j$−1), L1($j$), L1($j$+1) and the second control lines L2 ($i$−1), L2($i$), L2($i$+1). During the set/reset operation to and the read operation from the memory cell array M1, either of a group of the control lines L1 ($j$−1), L1($j$), L1($j$+1) or a group of the control lines L2 ($I$−1), L2($i$), L2($i$+1) is used as the word lines, and the other group is used as the bit lines.

Similarly, each of the memory cell arrays: M2, M3 and M4 is provided between the control lines of the lower layer and the control lines of the upper layer. During the set/reset operation and the read operation, one of the control line of the upper layer and the control line of the lower layer which sandwich the memory cell array is used as the word line and the other is used as the bit line.

The cell units CU1 are arranged at a portion where the control lines L1($j$−1), L1($j$), L1(J+1) and the control lines L2($i$−1), L2($i$), L2($i$+1) intersect with each other. Similarly, the cell units CU2 are arranged at a portion where the control lines L2($i$−1), L2($i$), L2($i$+1) and the control lines L3($j$−1), L3($j$), L3($j$+1) intersect with each other; the cell units CU3 are arranged at a portion where the control lines L3($j$−1), L3($j$), L3($j$+1) and the control lines L4($i$−1), L4($i$), L4($i$+1) intersect with each other; and the cell units CU4 are arranged at a portion where the control lines L4($i$−1), L4($i$), L4($i$+1) and the control lines L5($j$−1), L5($j$), L5($j$+1) intersect with each other.

In addition, if the memory cell arrays stacked are divided in each layer by the insulating film, the control lines extending in the first and second directions are not shared by two memory cell arrays stacked, but the control line as the word line and the bit line is provided for each memory cell array of each layer.

Figure 7:
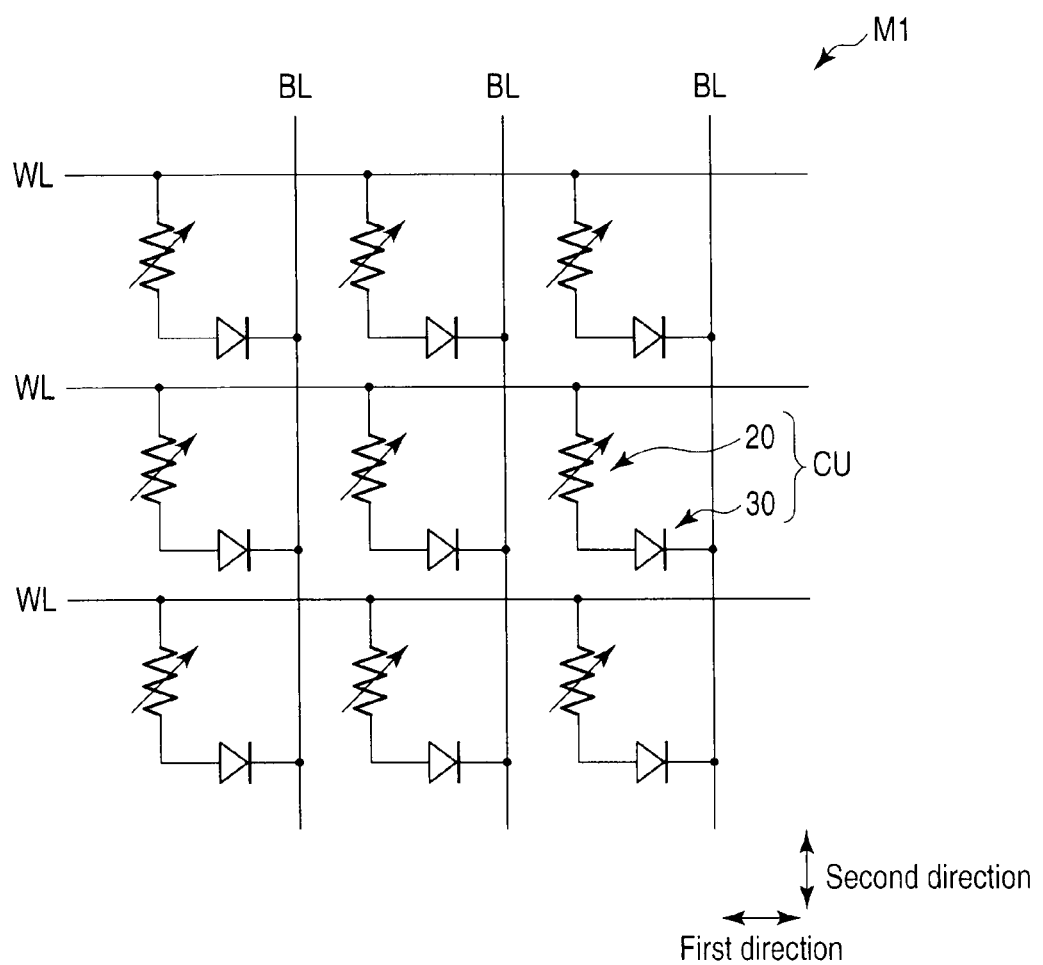
FIG. 7 is an equivalent circuit diagram of the memory cell array.

FIG. 7 shows one example of an equivalent circuit of the cross-point type memory cell array 2.

FIG. 7 shows the equivalent circuit of one memory cell array M1 including the cross-point type memory cell array 2.

A plurality of the first control lines extending in the first direction (row direction) are provided in the memory array M1. The first control line is, for example, the word line WL. The plurality of word lines WL are adjacent in the second direction to each other and arranged in the memory cell array M1.

A plurality of the second control lines extending in the second direction (column direction) are provided in the memory cell array M1. The second control line is, for example, the bit line BL. The plurality of bit lines BL are adjacent in the first direction to each other and arranged in the memory cell array M1.

In addition, the cell unit CU including the resistance change element 20 of the present embodiment is provided at a portion where the bit line BL and the word line WL three-dimensionally intersect with each other.

One cell unit CU includes the resistance change element 20 and a low electric field current limiting element 30. The resistance change element 20 and the low electric field current limiting element 30 are connected in series between the bit line BL and the word line WL.

The low electric field/current limiting element 30 (also called "a non-ohmic element") restricts the low electric field or the low current from being provided to the resistance change element 20 and inhibits the resistance change element 20 from malfunctioning. The low electric field current limiting element 30 is provided to inhibit the crosstalk to cell units which are not the object of operation (not selected) during an operation of the memory.

One example of the connection relationship of the cell unit CU with the bit line BL and the word line WL as shown in FIG. 7 is as follows. In addition, in the present embodiment, a case where a diode (rectifying element) is used for the low electric field/current limiting element 30 will be explained. For example, a PN diode, a PIN diode, MIS (Metal-Insulator-Semiconductor) diode, and the like are used as the diode 30.

As shown in FIG. 7, one end of the resistance change element 20 is connected to, for example, the word line WL. The other end of the resistance change element 20 is connected to, for example, an anode of the diode 30. A cathode of the diode 30 is connected to, for example, the bit line BL.

Note that an example in which the diode 30 is used as the low electric field current limiting element 30 has been explained in FIG. 7. However, according to an operation required for the resistance change memory, an SIS (Semiconductor-Insulator-Semiconductor) structure and MIM (Metal-Insulator-Metal) structure may be used as the low electric field current limiting element 30 instead of the diode. Moreover, the resistance change element 20 may be connected to the bit line BL side and the diode 30 may be connected to the word line side, which is opposite to a positional relationship between the resistance change element and the diode as shown in FIG. 7. Moreover, a direction of an anode of the diode 30 may be opposite to a direction of a cathode thereof.

The cross-point type memory cell array has been exemplified here and the structure of the memory cell array of the resistance change memory has been explained. The memory cell array of the resistance change memory is not, however, limited thereto, but may be formed using a memory cell including one resistance change element and the field effect transistor as a selection switch.

Using FIGS. 8 and 9, the structure of the cell unit including the resistance change element of the present embodiment will be explained.

FIG. 8 is a bird's eye view illustrating a structural example of the cell unit CU including the resistance change element 20 of the present embodiment. FIG. 9 is a sectional view illustrating a structure example of the cell unit CU including the resistance change element 20 of the present embodiment.

In examples shown in FIGS. 8 and 9, the diode 30 is stacked on the resistance change element 20.

A stacked body having the resistance change element 20 and the diode 30 is sandwiched by two control lines 50, 59 as one cell unit CU. The cell unit CU is provided on the control line 50 and the control line 59 is provided on the cell unit CU. One control line functions as the bit line BL and the other control line functions as the word line. Based on the connection relationship shown in FIG. 7, the control line 50 is the word line and the control line 59 is the bit line.

The diode 30 as the low electric field current limiting element includes two conductive layers 38, 39 and at least two layers sandwiched by the two conductive layers 38, 39. If the diode 30 is the PIN diode, the diode 30 includes a p-type semiconductor layer, an n-type semiconductor layer and an intrinsic semiconductor layer (an I-type semiconductor layer) sandwiched by the p-type semiconductor layer and the n-type semiconductor layer. An order of stacking the p-type and n-type semiconductor layers is different depending upon the connection relationship of the control line and the cell unit. According to the connection relationship shown in FIG. 7, the p-type semiconductor layer is provided on the electrode 28 of the resistance change element 20 through the conductive layer 38. The I-type semiconductor layer is provided on the p-type semiconductor layer and the n-type semiconductor layer 33 is provided on the I-type semiconductor layer. The conductive layer 39 is provided between the n-type semiconductor layer and the bit line 59. In addition, if the diode 30 is provided on the electrode 28 of the resistance change element 20, the conductive layer 38 may be omitted.

Note that, if the PN diode is used as the low electric field current limiting element 30, the PN diode 30 includes the p-type semiconductor layer and the n-type semiconductor layer. If an MIS diode is used as the low electric field current limiting element, the MIS diode 30 includes a semiconductor layer, a metal layer and an insulating layer sandwiched by the semiconductor layer and the metal layer.

As described above, the resistance change element 20 of the present embodiment includes the first resistance film 21, the second resistance film 22, and the barrier film 23 sandwiched by the two resistance films. The stacked body including the two resistance films 21, 22 and the barrier film 23 is sandwiched by the two electrodes 28, 29.

The first resistance film (cathode film) 21 is stacked on, for example, the second resistance film 22 through the barrier film 23. The second resistance film (anode film) 22 is stacked on the control line 50 through the electrode 29. The metal impurities (for example, Cu atoms) are included in at least one of the resistance films 21, 22. The electrode 28 is stacked on the resistance film 21.

The diode 30 is stacked on the electrode 28 of the resistance change element 20. The conductive layer 38 is provided on the bottom of the diode 30 and the conductive layer 39 is provided on the upper part of the diode. The conductive layers 38, 39 are used as electrodes of the diode, or adhesive layers and diffusion preventing layers. The adhesive layers prevent the resistance change element 20 from being detached from the control lines 50, 59 and diode 30. The diffusion preventing layers prevent diffusion of the impurities between the resistance change element 20 and diode 30 or between the resistance change element 20X and the control lines 50, 59. The electrodes 28, 29 may also have a function as the adhesive layers and the diffusion preventing layers.

The resistance change element 20 is connected in series to the diode 30 through the electrode 29 and the conductive layer 38.

As shown in FIG. 9, a side wall film 40 is provided on a side surface of the resistance change element 20. The side wall film 40 inhibits the metal impurities (for example, Cu) 24 added in the resistance films 21, 22 from diffusing to the outside. The material of the side wall film 40 is selected from SiN, $Al_2O_3$, TaO and the like. Preferably, the side wall film 40 is an insulating body. The side wall film 40 may have a function of inhibiting the impurities (for example, carbon or hydrogen) resulting from an interlayer insulation film (not shown) or the like covering the resistance change element 20 from being diffused into the resistance films 21, 22 and the barrier film 23. In this way, the side wall film 40 is provided on the side surface of the resistance change element 20, degradation of characteristics of the resistance change element 20 of the present embodiment and variance of characteristic of each element is thereby suppressed.

Note that, as shown in FIG. 9, the side wall film 40 continues between the resistance change element 20 and the diode 30 on the side surface of the cell unit CU, and a film that is the same as the side wall film 40 on the side surface of the resistance change element 20 may be provided on the side surface of the diode 30 and the side surface of the control line 59.

Using FIGS. 5 to 9, operations of the resistance change memory will be explained. In addition, operations of the cross-point type memory cell array having a circuit configuration (connection relationship) shown in FIGS. 7 to 9 will be explained here; however, it is apparent that the voltage and polarity applied to the bit line and word line are changed depending upon the circuit configuration of the memory cell array and cell unit.

First, the read operation of the resistance change memory using the resistance change element 20 of the present embodiment will be explained.

The control signal CMD, data DT and address signal ADR are input into a chip 1 from the outside.

The state machine 8 causes the row and column control circuits 3, 4 to drive the word line and the bit line based on the address signal ADR. The row control circuit 3 selects the word line indicated by the address signal ADR. The column control circuit 4 selects the bit line indicated by the address signal ADR. Hereinafter, the word line and the bit line which are the object of operation indicated by the address signal ADR are called a selected word line and a selected bit line, respectively, and the word lines and the bit lines other than the selected word line and the selected bit line are called a non-selected word line and a non-selected bit line, respectively.

Further, the state machine 8 causes the potential generator 10 to generate a predetermined voltage applied to the bit line and the word line depending upon operations to be performed. The voltage generating circuit 10 generates the read voltage Vrd when performing the read operation.

The read voltage Vrd generated is applied to the cell unit which is the object of operation (hereinafter called "selected cell unit") connected to the selected word line and the selected bit line. In the cell unit including the diode, as a forward bias is applied to the diode 30, the read voltage Vrd is applied to the selected word line and the selected bit line. For this reason, in the memory cell array having a circuit configuration shown in FIG. 7, for example, the read voltage Vrd (Vrd>0) is applied to the selected word line and the ground voltage (0 V) is applied to the selected bit line. The magnitude of the read voltage Vrd is smaller than the magnitude of the electromigration voltage Vset, Vreset. For this reason, application of the read voltage Vrd hardly causes migration of the metal impurities (electromigration) between the two resistance films 21, 22. For this reason, a write error at the time of reading is reduced.

On the other hand, when performing the read operation, in cell units other than the selected cell unit (hereinafter called "non-selected cell units"), as a reverse bias is applied to the diodes thereof, the non-selected voltage is applied to the non-selected word lines and the non-selected bit lines. As a result, the crosstalk resulting from the non-selected cell units is inhibited. The non-selected voltage is also generated by the potential generator 10.

Note that the magnitude of the non-selected voltage is also set so that the metal impurities including the resistance change element 20 of the present embodiment are not electromigrated similarly to the read voltage Vrd. Moreover, the magnitude of the non-selected voltage applied to the non-selected word lines and the non-selected bit lines is set so that a potential difference between the terminals of the non-selected cell units connected to the selected word line and a potential difference between the terminals of the non-selected cell units connected to the selected bit line become substantially 0 V.

In the memory cell array M1 having the circuit configuration shown in FIG. 7, when the forward bias is applied to the diode 30 in the selected cell unit, the selected word line is set on an anode side (high potential side) and the selected bit line is set on a cathode side (low potential side) by the state machine 8 and the row/column control circuits 3, 4.

According to the cell unit shown in FIGS. 8 and 9, if the metal impurities 24 are present in the resistance film 21 at a low potential on the control line side, electrons migrate from the selected bit line side to the selected word line side through the impurity level resulting form the metal impurities 24. As a result, a read current flows from the selected word line to the selected bit line through the diode 30 to which the forward bias has been applied.

On the other hand, if the metal impurities 24 are present in the resistance film 22 on the control line side at a high potential, no impurity level is present on the electron source side (diode side), electrons cannot thus exceed the band gap of the resistance film 21 and electrons hardly migrate in the resistance change element 20. As a result, even if the forward bias is applied to the diode, the current hardly flows between the selected word line and the selected bit line.

The resistance value of the resistance change element in the selected cell unit may be discriminated based on such difference between the magnitudes of the read current.

In this way, in the memory cell array M1 and the cell unit having a circuit configuration as shown in FIGS. 6 to 8, if the metal impurities 24 are present in the resistance film 21 at a low potential on the control line side, the resistance change element 20 exhibits the low-resistance state (set state), and if the metal impurities 24 are present in the resistance film 22 at a high potential on the control line side, the resistance change element 20 exhibits the high-resistance state (reset state).

As a result, data stored in the resistance change element 20 is read according to the resistance state of the resistance change element 20 as the memory element (memory device) in the selected cell unit.

According to the above, in the resistance change memory using the resistance change element 20 of the present embodiment, the resistance state of the resistance change element 20 as a memory element is discriminated based on control by the state machine (control circuit) 8 and data may be read.

Subsequently, the write/erasing operation of the resistance change memory will be explained using the resistance change element 20 of the present embodiment. The resistance change element of the present embodiment is driven by a bipolar operation. Therefore, in a case where the resistance state of the resistance change element 20 is shifted to the high-resistance state and in a case where the resistance state of the resistance change element 20 is shifted to the low-resistance state, the voltages whose polarities are opposite to each other are applied to the selected cell unit, the selected word line and the selected bit line.

During the write/erasing operation, the state machine 8 controls operations of the row/column control circuits 3, 4 and the potential generator 10 based on the input command signal CMD and the address signal ADR similarly to the read operation.

The row control circuit 3 selects the word line indicated by the address signal ADR and the column control circuit 4 selects the bit line indicated by the address signal ADR. The potential generator 10 generates the set voltage Vset during the write operation (set operation) or generates the reset voltage Vreset during the erasing operation (reset operation). Moreover, the potential generator 10 generates the non-selected potential applied to the non-selected word lines and the non-selected bit lines.

During the set operation, the state machine 8 controls the row/column control circuits 3, 4 and the potential generator 10, applies the set voltage Vset (Vset>0) to the selected word line and applies the ground voltage (0 V) to the selected bit line. The electric field directed from the selected word line side to the selected bit line side is thereby applied to the selected cell unit. In the cell unit shown in FIGS. 8 and 9, due to the electromigration of ions, the ionized metal impurities (metal ions) 24 in the resistance film 22 on the selected word line side (anode side) exceed (tunnel through) the barrier film 23 and migrate into the resistance film 21 on the selected bit line side (cathode side).

On the other hand, when performing the reset operation, the state machine 8 controls the row/column control circuits 3, 4 and the potential generator 10, applies the reset voltage Vreset to the selected word line and applies the ground voltage to the selected bit line. The set voltage and the reset voltage of the resistance change element of the bipolar operation have the polarities opposite to each other, in which case, therefore, the reset voltage Vreset is a negative voltage (Vreset<0) and, for example, satisfies the following relation, "−Vset".

As a result, the electric field directed from the selected bit line side to the selected word line side is applied to the selected cell unit. In the cell unit shown in FIGS. 8 and 9, due to the electromigration of ions, the metal ions 24 in the resistance film 21 on the selected bit line side (anode side) exceed (tunnel through) the barrier film 23 and migrate into the resistance film 22 on the selected word line side (cathode side).

However, if the polarities of the set voltage and the reset voltage are opposite to each other, the magnitude of the reset voltage Vreset (voltage value) may be different from the magnitude of the set voltage Vset, taking account of the voltage drop caused by the diode in the cell unit. Moreover, if the polarity of the reset voltage applied to the cell unit is opposite to that of the set voltage, the positive reset voltage Vreset (Vreset>0) may be applied to the selected bit line and the ground voltage may be applied to the selected word line.

In this way, the set operation (write operation) and the reset operation (erase operation) to the resistance change element 20 as the memory element is performed by the bipolar operation.

In addition, the magnitude of the non-selected voltage during the set operation and the reset operation is set appropriately so that 0 V or a voltage smaller than the electromigration voltage at which the metal impurities 24 are electromigrated may be applied to the non-selected cell units between the non-selected word lines and non-selected bit lines, the non-selected cell units between the selected word line and the non-selected bit lines or the non-selected cell units between the non-selected word lines and the selected bit line. The non-selected voltage is applied to the non-selected word lines and the non-selected bit lines. As a result, operation defects of the set operation and the reset operation performed to the non-selected cell units that are caused by the migration of the metal impurities 24 between the two resistance films are reduced.

As described above, in the resistance change memory using the resistance change element 20 of the present embodiment, the resistance state of the resistance change element 20 as the memory element may be varied by controlling the state machine (control circuit) 8.

In the resistance change element 20 of the present embodiment, the set operation and the reset operation depend on the magnitude of the electric field applied to the resistance change element. For this reason, the set operation and the reset operation of the resistance change element of the bipolar operation may be normally performed, which is hardly affected by difference between the magnitude of current when a forward bias of the diode in the cell unit is applied and the magnitude of current when a reverse bias thereof is applied.

Figure 10A:
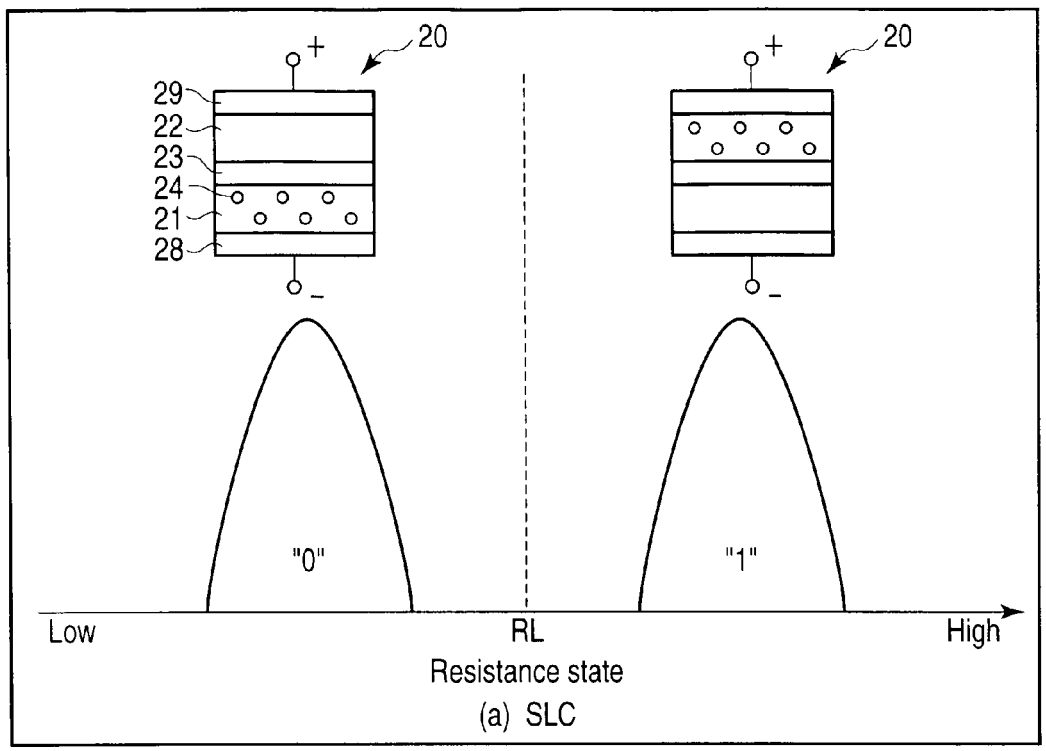
FIGS. 10A and 10B are views illustrating one example of a correspondence relationship between the resistance state of the resistance change element and data.
Figure 10B:
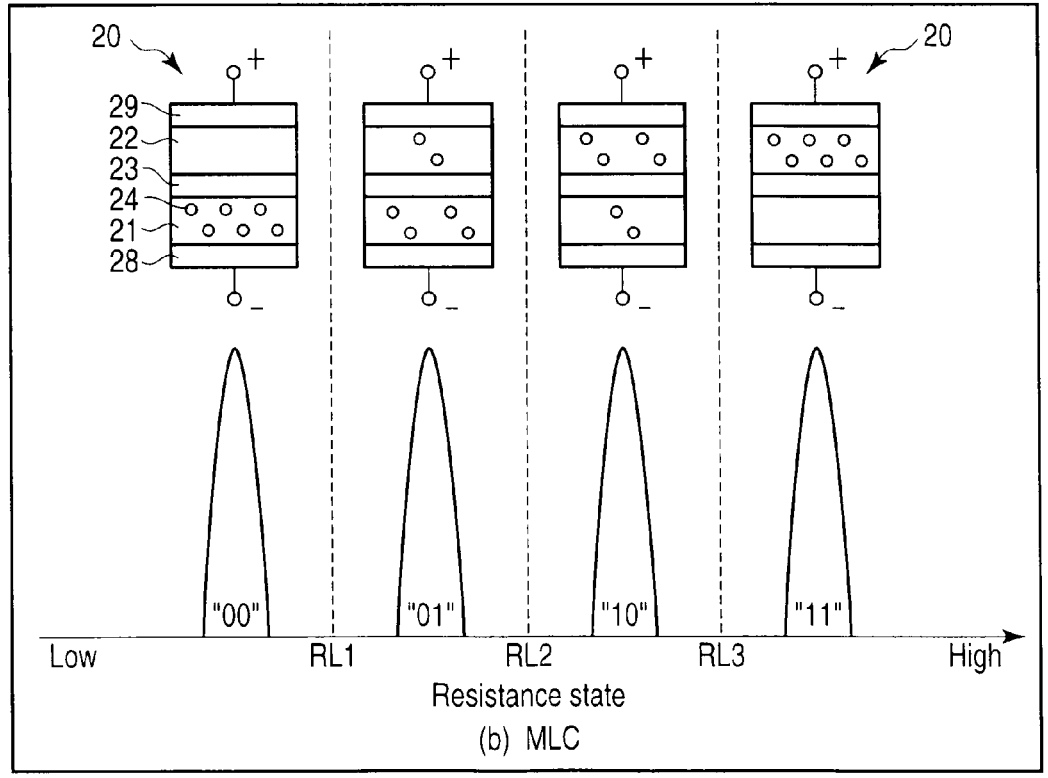

FIG. 10 is a graph illustrating a correspondence example between the resistance state of the resistance change element and data. In FIGS. 10A and 10B, a horizontal axis of a graph corresponds to the magnitude of the resistance value and a vertical axis of a graph corresponds to distribution of a resistance change element (existence probability) under a certain resistance value.

As shown in FIGS. 10A and 10B, a binary memory (SLC: Single Level cell) stores data of 1 bit, namely two values of "0" or "1" depending upon the magnitude (distribution) of the resistance values of the resistance change element 20 of the present embodiment.

For example, in an example shown in FIG. 10A, "0" data is assigned to the distribution of the low-resistance state of the resistance change storage element, and "1" data is assigned to the distribution of the high-resistance state of the resistance change storage element. In addition, for example, "0" data is set as a write (program) level, and "1" data is set as an erase level. Additionally, data stored in the resistance change element is determined based on a determination level RL set between two threshold levels (two distributions). In the above-described example, the determination level RL is set appropriately based on the shift of potential of the selected bit line on the low potential side or magnitude of current flowing in the selected bit line.

Moreover, the resistance change element 20 of the present embodiment may be used as a multivalue memory (MLC: Multi Level cell).

As shown in FIG. 10B, a plurality of write levels are set depending upon the magnitude of resistance values in the multivalue memory. FIG. 10B shows an example of a four-value memory. The four-value memory stores data of two bits.

In the four-value memory, similarly to the binary memory, data of four values (2 bits) is assigned to the resistance change element depending upon the magnitude of the resistance values. In the case of the four-value memory, "00", "01" and "10" are set as the write level, and "11" is set as the erasing level. In FIG. 10B, for example, "01", "00", "10" and "11" are assigned to each distribution of element to the resistance value, for example, in ascending order of the resistance value. In addition, similarly to the binary memory, the determination levels of data (resistance value): RL1, RL2, RL3 are set between each threshold level, respectively.

The resistance change element 20 of the first embodiment may control the concentration of the metal impurities 24 in the two resistance films 21, 22 by the voltage applied to the element 20. That is, the concentration of the metal impurities included in the two resistance films 21, 22 may be varied by adjusting the magnitude of the voltage (voltage value) applied to the resistance change element of the present embodiment, and an application time (pulse width) of the voltage depending upon data to be written as shown in FIG. 10B. As a result, the amount (number) of impurity levels occurring in the resistance film 21 on the cathode side when performing the read operation may be also controlled by the magnitude/pulse width of the voltage. For this reason, in the resistance change element 20 of the present embodiment, one resistance change element may be varied into three or more values. The resistance change element 20 of the present embodiment may be operated as the multivalue memory and the density of the memory capacity may be easily increased.

As described above, as shown in FIGS. 5 to 10B, the resistance change element 20 of the first embodiment may be applied to the resistance change memory. Using the resistance change element 20 of the present embodiment, the resistance change memory with improved characteristics may be provided.

(c) Production Process

Using FIGS. 11 to 16, a production process of the resistance change element 20 of the first embodiment will be explained. In addition, a production process of the cross-point type memory cell array shown in an example of application will be explained, in addition to the production process of the resistance change element. In each production process shown in FIGS. 11 to 16, sectional flow diagrams along the parallel direction to the substrate surface are shown, respectively.

A production process in which Si is used for the resistance film of the resistance change element and $SiO_2$ is used for the barrier film of the resistance change element will be explained here.

As shown in FIG. 11, an interconnect layer (for example, tungsten layer) 50A as the control line is stacked on the substrate (for example, an interlayer insulation film) 11 using a sputtering method. A TiN film 29A as the electrode of the resistance change element is formed on the interconnect layer 50A. For example, the constituent element of the resistance change memory such as a field effect transistor is formed on the upper surface of the semiconductor substrate below the interlayer insulation film 11.

A Si film 22A, a $SiO_2$ film 23A and a Si film 21A are deposited on the TiN film 28A using a film depositing technology such as LPCVD (Low Pressure Chemical Vapor Deposition) or PECVD (Plasma-enhanced CVD).

Preferably, a film thickness of the Si films 21A, 22A is in a range of 0.5 to 40 nm. However, it is not necessary that the film thickness of the two Si films 21A, 22A be the same.

Preferably, the film thickness of $SiO_2$ as the barrier film is, for example, in the range of 0.5 to 30 nm. However, the film thickness of the barrier film 23A is set so that the metal impurities that will be added in the later step are not diffused between the two Si films 21, 22 when the voltage is not added to the resistance change element or the read voltage has been applied thereto.

In addition, the film thickness of these films 21A, 22A and 23A varies depending upon a size (dimension) of the resistance change element formed by the production process of the present embodiment in the parallel direction to the substrate surface.

While either of the two films 21A and 22A (Si film 21A, here) is deposited, gas 81 including the metal impurities (Cu, here) 24 is combined with $SiH_4$ or $Si_2H_6$ as a starting material gas (source gas) 80 of Si. As a result, Cu atoms as the metal impurities 24 which are electromigrated in the resistance film are added to either the Si film 21A or 22A. The concentration of the metal impurities (Cu) 24 included in the Si films 21A, 22A is controlled by adjusting a mixing ratio between gas including Cu and the starting material gas of Si.

However, as shown in FIG. 12, Cu ion 82 may be introduced in the Si film 21A that has been deposited by controlling the concentration of the metal impurities to be added using an ion implantation method.

Further, as shown in FIG. 13, the metal film (Cu film, here) 83 is formed on the Si film 22A using, for example, the sputtering method. The heat treatment is performed thereafter, and the Cu atom 24 which is a constituent atom of the Cu film 83 may be thermally diffused in the Si film 21A. The concentration of the Cu atoms added to the Si film 21A is controlled by time or temperature of the heat treatment. The remaining Cu film 83 is detached. However, the remaining Cu film 83 may remain on the Si film 21A as part of the electrode of the resistance change element of the present embodiment.

Note that Cu is used as the metal impurity 24 here. However, Ag, Ni, or the like may be used as the metal impurity instead of Cu. For example, as it is difficult for Ag to form a compound with Si compared to Cu, there may be a case where Ag is preferably added in the Si film as the metal impurity, depending upon a production process of the resistance change memory.

As shown in FIG. 14, the conductive layer 28A as the electrode of the resistance change element is deposited on the Si film 21A. The conductive layer 28A is, for example, TiN. However, the conductive layers 28A, 29A for forming the electrode of the resistance change element are not limited to TiN, and another material which does not react with the resistance film 21A (Si film, here) and does not react with the metal impurities 24 to be implanted may be used. For example, materials such as TaN, NbN, WN, MoN, WSi may be used for the material for forming the electrode. Further, the structure of the conductive layer 28A is not limited to a single layer structure, but may be a laminated structure having two or more kinds of conductive materials.

For example, a constituent member 30A for forming the low electric field current limiting element (for example, diode) is deposited on the conductive layer 28A. For example, the conductive layer 38A is formed between a bottom of the constituent member 30A and the TiN film 29A and the conductive layer 39A is formed on the constituent member 30A.

The conductive layers 38A, 39A are used as electrodes of the diode or adhesive layers, diffusion preventing layers, etc.

A resist film (not shown) is applied on the constituent member of the cell unit stacked on the substrate 11. After this resist film has been patterned using a photolithographic technology, the RIE (Reactive Ion Etching) method is performed using the patterned resist film as a mask.

Figure 15:
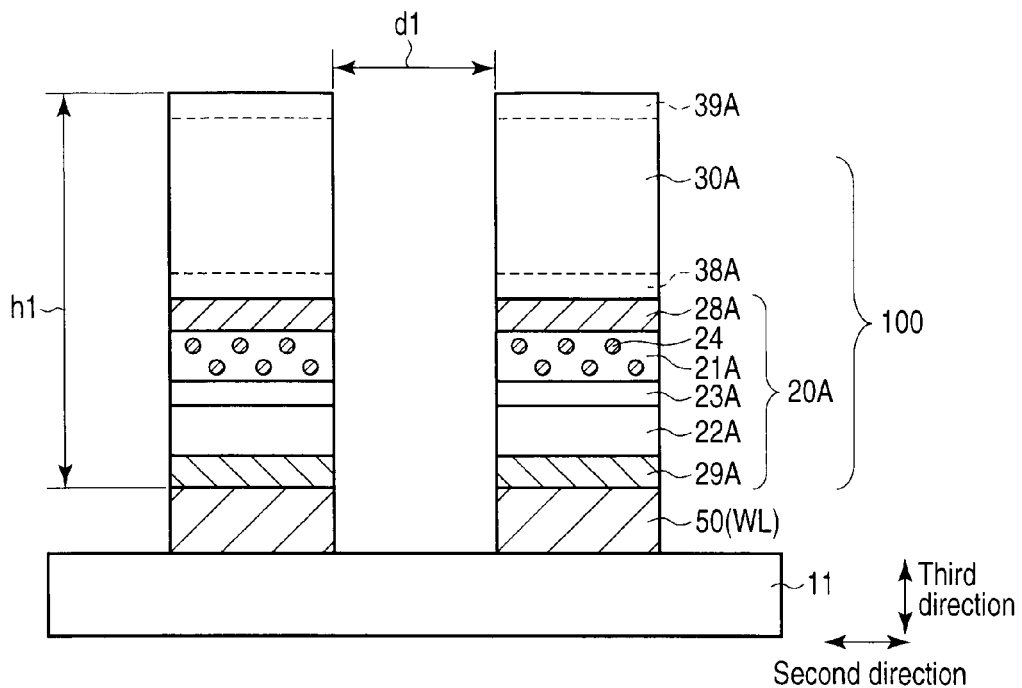
FIG. 15 is a sectional flow diagram illustrating one step of the production process of the resistance change element.

According to the above, as shown in FIG. 15, a stacked body 100 for forming the resistance change element and the cell unit of the present embodiment is formed on the substrate 11. A plurality of stacked bodies 100 are divided, for example, in the second direction by etching. Additionally, the stacked body 100 extends in the first direction. The two stacked bodies 100 which are adjacent to each other are adjacent in the second direction with a space d1.

At the same time as the formation of the stacked body 100, a interconnect layer is processed and the plurality of control lines 50 divided in the second direction are formed on the substrate 11. The control line 50 extends in the first direction.

The stacked body 100 includes the constituent member 20A of the resistance change element and the constituent member 30A of the diode. The stacked body 100 and the control line 50 are formed, whereby the level difference resulting from height of the cell unit (a size in the third direction) h1 occurs between the upper part of the stacked body 100 in the third direction and the surface of the substrate 11.

Figure 16:
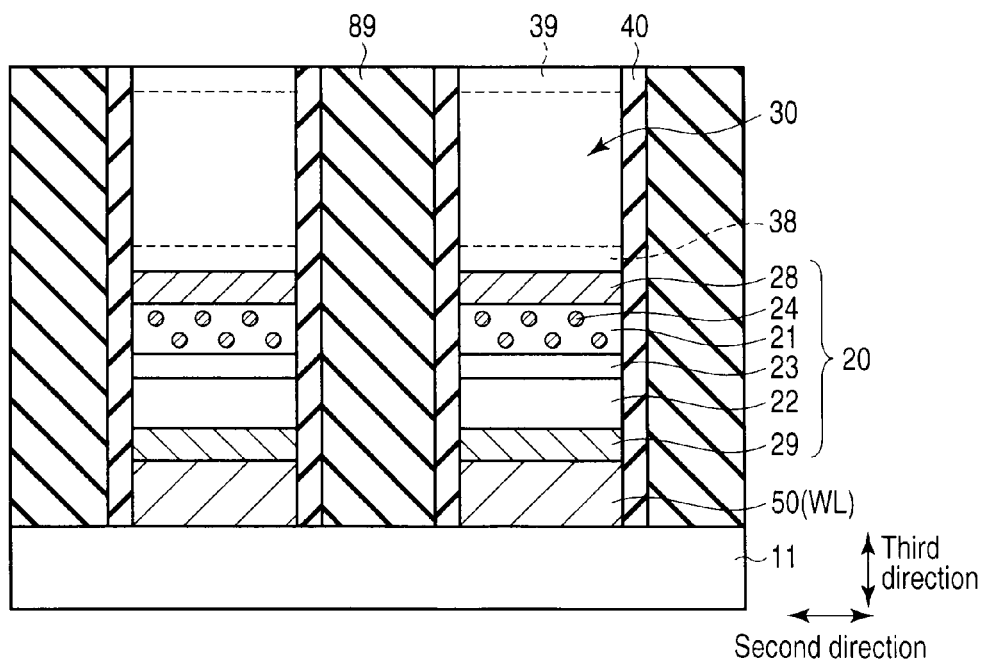
FIG. 16 is a sectional flow diagram illustrating one step of the production process of the resistance change element.

Thereafter, as shown in FIG. 16, the stacked body 100 extending in the first direction is divided in the first direction. When this processing is performed, etching conditions (for example, etching selection ratio) are controlled in order not to divide the control line 50 extending in the first direction. As a result, the cell unit including the resistance change element 20 and the diode 30 is formed on the control line 50.

The side wall film (for example, SiN film) 40 is formed on the side surface of the stacked body 100 so as to cover the side surface of the formed stacked body (cell unit). The SiN film 40 as the side wall film is a material for inhibiting the external diffusion of the Cu atom 24 in the Si films 21, 22. The Cu atom 24 as the metal impurity may be thereby inhibited from being diffused to the outside of the Si films 21, 22. The materials of the side wall film 40 may be not only SiN but also $Al_2O_3$ or $TaO_x$ ($0 < x \leqq 2$).

The interlayer insulation film 89 is embedded between the adjacent cell units thereafter. The control line (not shown) extending in the second direction is then formed on the cell unit CU and the interlayer insulation film 89 using the sputtering method, photolithography and RIE method.

In addition, in the cross-point type memory cell array shown in FIG. 6, a step of etching the constituent members of the two memory cell arrays that are stacked for the purpose of dividing the stacked body 100 as the cell unit in the first direction may be performed simultaneously for simplicity of the production process.

That is, after a process shown in FIG. 15 has been performed, the stacked body 100 extending in the first direction is not divided in the first direction, and the side wall film 40 and the interlayer insulation film 89 are formed between the adjacent stacked bodies 100. The interconnect layer for forming the control line (the bit line, here) is deposited on the interlayer insulation film and the stacked body 100. The constituent member for the second memory cell array is deposited on the interconnect layer using the method substantially the same as that shown in FIGS. 11 to 14.

Thereafter, the patterning and etching for dividing the constituent members of the second memory cell array and the stacked body 100 of the first memory cell array in the first direction are performed. One step for processing the first memory cell array and one step of processing the second memory cell array stacked on the first memory cell array are mutually performed thereby.

Simultaneously, the interconnect layer sandwiched by the two stacked memory cell arrays is also processed at the same time as processing of the two memory cell arrays in the first direction. For this reason, the control line extending in the second direction is formed at the same time as processing of the first and second memory cell arrays in the first direction.

In this way, at the same time as processing for forming the n-th (n>0) memory cell array (cell unit), processing for forming the (n+1)th memory cell array is performed. As a result, this production process is simplified compared to a production process including processing the memory cell array of the lower layer in the first and second directions and thereafter forming the memory cell array of the upper layer.

Note that a mask for forming the control line and the cell unit may be formed using side wall processing technology without using a resist.

The above-described production process is repeated until a predetermined number of memory cell arrays are stacked, and the resistance change memory shown in FIGS. 6 to 10 is thereby formed.

According to the above-described production process, the resistance change element 20 of the present embodiment is formed. The resistance change element 20 formed using this production process includes the two resistance films 21, 22, the barrier film 23 sandwiched between the two resistance films 21, 22 and the metal impurities 24 in the resistance films 21, 22.

That is, according to the production process shown in FIGS. 11 to 16, when performing the write and erasing operations to and from the resistance change element as the memory element, application of the electromigration voltages Vset, Vreset causes the electromigration of the metal impurities 24, and the resistance change element 20 whose resistance state varies into two or more states may be formed thereby.

If the electric field is not applied to the resistance change element 20 of the present embodiment or the voltage lower than the electromigration voltage (for example, the read voltage Vrd) has been applied to the element 20, the migration of the metal impurities 24 is inhibited by the barrier film 23 sandwiched by the resistance films 21, 22. Therefore, according to the above-described production process, the resistance change element as a memory element having the improved retention characteristic of data and the resistance change element 20 and a highly reliable may be provided.

Further, as described above, the production process of the resistance change element 20 of the present embodiment does not require a forming step of the filaments in the resistance change element. For this reason, according to the resistance change element 20 of the present embodiment, the production process and production cost of the resistance change memory may be reduced.

In addition, in the present embodiment, if forming only the resistance change element 20 of the present embodiment alone, steps of forming the constituent members 30A, 38A and 39A of the diode 30 during the production process shown in FIGS. 14 and 15 may be omitted.

As described above, according to the production process of the resistance change element of the present embodiment, the resistance change element with improved characteristics may be formed. Simultaneously, the resistance change memory including the resistance change element of the present embodiment may be provided.

(2) The Second Embodiment

Using FIG. 17, the resistance change element of the second embodiment will be explained. In addition, the difference between the second embodiment and the first embodiment will be mainly explained here, and parts that are similar between the second embodiment and the first embodiment will be explained as necessary.

FIG. 17 illustrates a cross-sectional structure of the cell unit CU using the resistance change element 20X of the present embodiment. The connection relationship of the cell unit CU (resistance change element 20X) with the word line 50 and the bit line 59 shown in FIG. 17 is substantially the same as the connection relationship of the cell unit shown in FIGS. 7 to 9.

In the resistance change element 20X of the second embodiment, the first and second resistance films 21N, 22P are made of, for example, Si. The material of the barrier film 23X is, for example, $TiO_x$ ($0 < x \leqq 2$).

The Si films 21N, 22P as the first and second resistance films include impurities as a donor or an acceptor (called "donor impurities" or "acceptor impurities", respectively).

For example, the Si film 22P as the resistance film is doped with B (boron) as the acceptor impurities. The Si film 21N as the second resistance film is doped with As (arsenic) or P (phosphorus) as the donor impurities.

In this way, the first resistance film 21N is doped with the donor impurities, the resistance film 21N then becomes a semiconductor layer exhibiting an n-type (first conductivity type) conductivity (n-type Si film, here). Moreover, the second resistance film 22P is doped with the acceptor impurities, whereby the resistance film 22P then becomes a semiconductor layer exhibiting a p-type (second conductivity type) conductivity (p-type Si film, here).

The $TiO_x$ film as the barrier film 23X inhibits the thermal diffusion of the metal impurities (for example, Cu atoms) 24 added in the resistance films 21N, 22P and functions as a barrier of the diffusion of the Cu atoms (Cu ions) at the time of low electric field driving, and $TiO_x$ is a semiconductor layer exhibiting the n-type conductivity.

In the resistance change element 20X of the second embodiment, the resistance films 21N, 22P and the barrier film 23X are formed using the p-type or n-type semiconductor. For this reason, the stacked body having the p-type Si/n-type $TiO_2$/n-type Si included in the resistance change element 20X forms a pn junction diode. Therefore, the resistance change element 20X of the second embodiment has a function as a rectifying element in addition to a function as the memory element.

In that case, in the resistance change memory using the resistance change element of the resistance change element 20X of the second embodiment, the cell unit CU does not include a diode as a structure separated from the memory element (resistance change element).

That is, as shown in FIG. 17, in the cell unit CU using the resistance change element 20X of the present embodiment, the diode as a structure separated from the resistance change element 20X is not provided between the bit line BL and the word line WL. One end of the resistance change element 20X (electrode 29) directly contacts with the control line 50 and the other end of the resistance change element 20X (electrode 28) directly contacts with the control line 59.

However, a natural oxide film, a natural nitride film, and the like may be interposed between the electrode 29 and the control line 50 and between the electrode 28 and the control line 59. Further, a conductive material such as adhesive layer or diffusion preventing layer may be provided between the electrode 29 and the control line 50 and between the electrode 28 and the control line 59.

For example, when reading data, the forward bias is applied to the diode in the selected cell unit. For this reason, in the resistance change element 20X of the present embodiment, based on an operation principle shown in FIGS. 3 and 4, if the metal impurities 24 are present in the n-type resistance film 21N which is a cathode of the diode, supply of electrons through the impurity level increases the output current of the diode in the forward biased direction. Therefore, the resistance change element 20X of the present embodiment exhibits the low-resistance state if the metal impurities 24 are present in the n-type resistance film 21N.

On the other hand, if the metal impurities 24 are present in a p-type resistance film 22P which is an anode of the diode, supply of electrons through the impurity level does not occur, and the output current of the diode in the forward biased direction decreases compared to a case where the metal impurities 24 are present in the n-type resistance film 21N. Therefore, the resistance change element 20X of the present embodiment exhibits the high-resistance state if the metal impurities 24 are present in the p-type resistance film 22P.

The resistance change element 20X of the second embodiment may be applied to the resistance change memory shown in FIGS. 5 to 10 similarly to the resistance change element 20 of the first embodiment.

In the cross-point type memory cell array shown in FIGS. 6 and 7, when the set/reset/read voltage (selected voltage) for driving the selected resistance change element (called "a selected cell unit") is applied, the selected voltage will be applied also to the non-selected cell unit (half-selected cell unit) connected to the selected bit line or the selected word line. For this reason, in order to inhibit a current from flowing in the half-selected cell unit and the non-selected cell unit, the diode is connected to the resistance change element in series in the cell unit of the cross-point type memory cell array as shown in FIGS. 7 to 9.

Like the resistance change element 20X of the second embodiment, providing the resistance change element 20X as the memory element in itself with a rectifying function eliminates the necessity of providing the diode as the separate structure between the word line and the bit line. For this reason, the resistance change memory using the resistance change element 20X of the second embodiment may reduce a step of forming the diode and reduce the production cost of the resistance change memory.

Additionally, in the resistance change element 20X of the present embodiment, the necessity of forming the diode separately from the resistance change element is eliminated. Therefore, in the present embodiment, height h2 of the cell unit CU is reduced compared to that of the cell unit having the stacked body of the resistance change element and the diode. For this reason, the level difference between the stacked body 100A and the substrate 11 as shown in FIG. 15 may be reduced and an aspect ratio h1/d1 may be decreased. As a result, difficulty in processing the memory cell array may be extensively reduced. Especially, in the production process of processing the two stacked memory cell arrays at the same time, the effect of reducing the aspect ratio of the cell unit is remarkable. Accordingly, an interval d1 between the adjacent stacked bodies 100 as shown in FIG. 15 may be reduced also, which may thus increase a storage density of the memory cell array to a certain area and reduce the bit cost.

The production process of the resistance change element 20X and the resistance change memory including the resistance change element 20X of the second embodiment merely adds a step in which the deposited Si film is doped with the donor/acceptor impurities, with the remainder of the production process being substantially the same as a step shown in FIGS. 11 to 16.

In the resistance change element 20X of the second embodiment, the $TiO_x$ film is used as the barrier film. Ti has a larger absolute value of a Gibbs' oxide formation free energy than that of Si. For this reason, in the production process of the resistance change element 20X and the resistance change memory including the resistance change element 20X of the present embodiment, even if a heat treatment is performed at high temperature during the process, $TiO_x$ is not reduced by Si. Therefore, according to the resistance change element 20X of the present embodiment, the resistance change element with high heat resistance may be produced.

Note that the material is not limited to those described in the present embodiment (Si and $TiO_x$), but a combination which may inhibit an oxidation-reduction reaction of the constituent element of a semiconductor for forming the resistance film and the constituent element of the barrier film may be used as the material. Moreover, the barrier film is not limited to the n-type semiconductor material but may be the p-type semiconductor material.

As described above, according to the resistance change element 20X of the second embodiment, characteristics of the resistance change element may be improved similarly to the first embodiment. Additionally, according to the resistance change element 20X of the second embodiment, the production cost of the resistance change memory may be reduced.

OTHERS

In the present embodiment, the first and second films of the resistance change element are called the resistance films, but the first and second films may be called storage layers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change element comprising:
a first film provided on a first electrode side;
a second film provided on a second electrode side;
a barrier film sandwiched between the first film and the second film; and
metal impurities added in the first or second film, the metal impurities migrating between the first and second films bi-directionally according to a direction of a first electric field generated between the first and second electrodes, and the first electric field having a magnitude such that the ionized metal impurities migrate between the first and second films via the barrier film,
wherein a first resistance state is exhibited when the metal impurities are present in the first film, and
a second resistance state different from the first resistance state is exhibited when the metal impurities are present in the second film.

2. The resistance change element according to claim 1, wherein the materials of the first and second films are materials having a band gap.

3. The resistance change element according to claim 1, wherein the material of the first and second films is at least one material selected from a group consisting of Si, $SiO_x$, SiCO, Ge, $TiO_x$, C, and SiGe ($x \geq 1$).

4. The resistance change element according to claim 1, wherein the first film is a semiconductor layer having a first conductivity type,
the second film is a semiconductor layer having a second conductivity type different from the first conductivity type, and
the barrier film is a semiconductor layer having the first conductivity type.

5. The resistance change element according to claim 3, wherein the first and second films form a junction exhibiting a rectifying property.

6. The resistance change element according to claim 1, wherein the barrier film has a thickness preventing migration of the metal impurities between the first and second films when a value of the electric field between the first and second electrodes is smaller than said magnitude of the first electric field.

7. The resistance change element according to claim 1, wherein when discriminating the first resistance state from the second resistance state that is higher than the first resistance state, the first electrode is set on the cathode side and the second electrode is set on the anode side.

8. The resistance change element according to claim 1, wherein the metal impurity is at least one atom selected from a group consisting of Cu, Ag and Ni.

9. The resistance change element according to claim 1, wherein the constituent element of the barrier film has an absolute value of Gibbs' oxide formation free energy that is larger than that of the constituent elements of the first and second films.

10. The resistance change element according to claim 1, wherein the material of the barrier film is at least one material selected from a group consisting of $SiO_x$, $SiN_x$, $SiC_x$, $TiO_x$, $TiN_x$, Ta, $TaO_x$, $TaN_x$, Nb, $NbO_x$, $NbN_x$, W, $WO_x$ and $WN_x$ ($x \geq 1$).

11. The resistance change element according to claim 1, wherein the first and second resistance states are associated with data to be stored.

12. A resistance change memory comprising:
a first interconnect line extending in a first direction;
a second interconnect line extending in a second direction that intersects the first direction; and
a cell unit provided between the first interconnect line and the second inter connect line, the cell unit including a memory element in which data to be stored and a variable resistance value are associated,
the memory element including first and second electrodes, first and second films between the first and second electrodes, a barrier film between the first film and the second film and metal impurities added in the first or second film,
wherein the metal impurities migrate between the first and second films bi-directionally according to the direction of a first electric field generated between the first and second electrodes, and the first electric field having a magnitude such that the ionized metal impurities migrate between the first and second films via the barrier film,
when the metal impurities are present in the first film, the memory element exhibits a first resistance state, and
when the metal impurities are present in the second film, the memory element exhibits a second resistance state different from the first resistance state.

13. The resistance change memory according to claim 12, wherein the materials of the first and second films are materials having a band gap.

14. The resistance change memory according to claim 12, wherein the first film is a semiconductor layer having a first conductivity type,
the second film is a semiconductor layer having a second conductivity type different from the first conductivity type, and
the barrier layer is a semiconductor layer having the first conductivity type.

15. The resistance change memory according to claim 12, wherein the memory element has a rectifying property.

16. The resistance change memory according to claim 15, wherein the first electrode contacts with the first interconnect line, and the second electrode contacts with the second interconnect line.

17. The resistance change memory according to claim 12, wherein the barrier film has a thickness preventing migration of the metal impurities between the first and second films when a value of the electric field between the first and second electrodes is smaller than said magnitude of the first electric field.

18. The resistance change memory according to claim 12, wherein when reading data from the memory element, the first electrode is set on a cathode side and the second electrode is set on an anode side.

19. The resistance change memory according to claim 12, wherein when writing data to the memory element, the metal impurities are ionized by the first electric field, and the ionized metal impurities tunnel through the barrier film.

20. The resistance change memory according to claim 12, further comprising:
   a control circuit configured to control operations of the cell unit,
   wherein the control circuit controls a potential of the first and second interconnect lines to allow the metal impurities to migrate in the first film when shifting the resistance state of the memory element to the first resistance state, and controls a potential of the first and second interconnect lines to allow the metal impurities to migrate in the second film when shifting the resistance state of the memory element to the second resistance state.

* * * * *